United States Patent [19]
Bell et al.

[11] Patent Number: 5,325,500
[45] Date of Patent: Jun. 28, 1994

[54] PARALLEL PROCESSING UNITS ON A SUBSTRATE, EACH INCLUDING A COLUMN OF MEMORY

[75] Inventors: Alan G. Bell, Palo Alto; John Lamping, Los Altos; Michael Dixon, San Francisco, all of Calif.

[73] Assignee: Xerox Corporation, Stamford, Conn.

[21] Appl. No.: 628,916

[22] Filed: Dec. 14, 1990

[51] Int. Cl.$^5$ ............................................. G06F 13/00
[52] U.S. Cl. ............................. 395/425; 364/DIG. 1; 364/229; 364/229.2
[58] Field of Search ... 364/200 MS File, 900 MS File; 395/425

[56]         References Cited
        U.S. PATENT DOCUMENTS

| | | | |
|---|---|---|---|
| 3,970,998 | 7/1976 | Weisbecker | 340/172.5 |
| 4,426,629 | 1/1984 | Fouse | 333/165 |
| 4,432,055 | 2/1984 | Salas et al. | 395/400 |
| 4,633,472 | 12/1986 | Krol | 371/40 |
| 4,709,327 | 11/1987 | Hillis et al. | 364/200 |
| 4,739,474 | 4/1988 | Holsztynski | 364/200 |
| 4,742,552 | 5/1988 | Andrews | 382/41 |
| 4,752,873 | 6/1988 | Shonai et al. | 364/200 |
| 4,760,523 | 7/1988 | Yu et al. | 364/200 |
| 4,773,038 | 9/1988 | Hillis et al. | 364/900 |
| 4,827,403 | 5/1989 | Steele, Jr. et al. | 364/200 |

(List continued on next page.)

FOREIGN PATENT DOCUMENTS 0251594 1/1988 European Pat. Off. .
0293701 12/1988 European Pat. Off. .

OTHER PUBLICATIONS

Correction Machine Model CM-2 Technical Summary, Thinking Machines Corp., Cambridge, Mass., Apr. 21, 1987, pp. 1-7 and 19-30.

(List continued on next page.)

*Primary Examiner*—Joseph L. Dixon
*Assistant Examiner*—Matthew M. Kim

[57] ABSTRACT

Parallel processing circuitry on a substrate includes an array of memory elements in rows and columns. Row select circuitry can select the memory elements in any of the rows. Each column has respective processing circuitry to access its memory elements. The columns' processing circuitry can perform operations on data in parallel, so that each column and its processing circuitry form a processing unit. Data can be transferred to or from any of the columns. A column register can be connected so that data from a first column can be read, stored, and then written into a second column. Or a permutation network with connecting lines can be set up so that each connecting line can transfer data from one column to another. The column register can be connected to a shift register for transferring data to or from an external connection. Or the connecting lines of the permutation network can be set up for transferring data to or from the external connection. The processing circuitry of all the columns are connected to receive signals that control their operations in parallel. The processor can be used to perform value assignment search, with each processing unit storing data indicating a respective combination of values. Initially, an initial processing unit has a valid bit in its memory set to indicate that its combination of values is consistent with constraints. Then data from one processing unit can be copied to another, and modified either in the source or in the destination processing unit to obtain two respective subcombinations of values, with the valid bit remaining set. The processing units can perform operations in parallel to determine whether their respective combinations are consistent with a constraint. If a combination is inconsistent, the respective valid bit is cleared.

33 Claims, 26 Drawing Sheets

U.S. PATENT DOCUMENTS

| | | | |
|---|---|---|---|
| 4,901,224 | 2/1990 | Ewert | 395/250 |
| 4,949,243 | 8/1990 | Ali et al. | 364/200 |
| 4,954,945 | 9/1990 | Inoue | 364/200 |
| 5,008,815 | 4/1991 | Hillis | 395/800 |
| 5,014,235 | 5/1991 | Morton | 364/900 |
| 5,014,244 | 5/1991 | Lammerts et al. | 365/189.05 |
| 5,070,446 | 12/1991 | Salem | 395/500 |
| 5,088,048 | 2/1992 | Dixon et al. | 395/11 |
| 5,109,520 | 4/1992 | Knierim | 395/800 |
| 5,111,386 | 5/1992 | Fujishima et al. | 395/425 |
| 5,129,092 | 7/1992 | Wilson | 395/800 |
| 5,146,606 | 9/1992 | Grondalski | 395/800 |
| 5,165,023 | 11/1992 | Gifford | 395/325 |

OTHER PUBLICATIONS

Correction Machine Model CM-2 Technical Summary, Thinking Machines Corp., Cambridge, Mass., Nov. 1990, pp. 81–90.

Mick, John; Brick James, Bit-Slice Microprocessor Design, San Francisco: McGraw-Hill Book Company; 1980: pp. 93–127.

Toshiba MOS Memory Products Data Book; Memory; 1989; pp. B-57–B-102.

Dixon, M. Massively Parallel Assumption-based Truth Maintenance, Proceedings AAAl-88, Seventh National Conference on Artificial Intelligence; Aug. 21–26, 1988, St. Paul, Minn.: AAAl; 1988; pp. 199–204.

Types SN54147, SN54148, SN54LS147, SN54LS148, SN74147, SN74148(TIM9907), SN74LS147, SN74LS148, 10-line-to-4-line and 8-line-to-3-line Priority Encoders, The TTL Data Book for Design Engineers, Second Ed., Texas Instruments, 1981, pp. 7-151 through 7-156.

PARALLEL PROCESSING UNITS ON A SUBSTRATE, EACH INCLUDING A COLUMN OF MEMORY

BACKGROUND OF THE INVENTION

The present invention relates to integrated circuitry that can perform operations in parallel.

Hillis et al., U.S. Pat. No. 4,709,327, describe a parallel processor/memory circuit for use in a highly parallel processor. As shown and described in relation to FIGS. 1A and 5 of the patent, an array of parallel processing integrated circuits (ICs) contains 32,768 identical ICs, each containing 32 identical processor/memories. For rapid interchange of data in random directions between processor/memories, the ICs are interconnected in a Boolean n-cube of fifteen dimensions. Each IC includes logic circuitry to control routing of messages within the interconnection network, shown and described in detail in relation to FIGS. 6B and 11–16, and includes bus connections from the routing circuitry to its processor/memories so that every processor/memory in the array can send a message to every other processor/memory. As shown and described in relation to FIGS. 6A and 17, the processor/memories on an IC are connected in an array but are laid out in groups of four with bus drivers interspersed between them. Each processor/memory includes 384 bits of dynamic read-write storage (RAM), addressing circuitry, an ALU, a flag register, addressing circuitry for the flag register, and various driver circuits, shown and described in detail in relation to FIGS. 7A and 7B. As shown and described in relation to FIG. 6B, each IC also includes a programmable logic array (PLA) that receives and decodes instructions that are then used by the processor/memories. As shown and described in relation to FIG. 17, a signal bus from the PLA to the processor/memories is an array of lines, and the signal flow in the processor/memory is essentially at right angles to the bus to minimize line crossings and simplify circuit layout. Approximately 1800 transistors are required to implement one processor/memory in VLSI. As shown and described in relation to FIGS. 7A and 7B, the ALU of a processor/memory operates on data from two registers in RAM and one flag input, and produces a sum output that is written into one of the RAM registers and a carry output that is available to registers in the flag controller and to certain other processor/memories. ALU operations take place in two cycles, a read cycle and a conditional write cycle. The RAM includes twelve registers of thirty-two bits each, with each bit separately addressable by column. Register address lines are provided to access up to 16 registers. The ALU includes a one-out-of-eight decoder, a sum output selecter, and a carry output selector. The ALU can produce the sum and carry outputs of thirty-two functions that are all variations of the five basic operations ADD, OR, AND, MOVE, and SWAP.

Mick, J., and Brick, J., *Bit-slice Microprocessor Design*, McGraw-Hill, 1980, pp. 93–127 describe the Am2901A and Am2093, arithmetic logic unit/function generators that perform arithmetic/logic operations on two four-bit input variables. FIG. 7 shows a simple data handling path of a minicomputer. FIG. 13 shows the Am2901A architecture, with more detail in FIG. 14. All data paths within the circuit are four bits wide. Data can be read from any two of the words in the 16-word by 4-bit 2-port RAM and provided to the ALU and the result written to the location of one of the two words. The ALU, a high-speed arithmetic/logic operator, can perform three binary arithmetic and five logic operations on the two 4-bit input words, as shown in FIG. 15. FIG. 16 shows the Am2903 architecture, which performs all the functions of the Am2901A and has enhancements enabling it to perform special functions as shown in FIG. 17 and seven arithmetic and nine logic operations on two 4-bit operands, as shown in FIG. 18.

*Toshiba MOS Memory Products Data Book*, February 1989, pp. B-57 through B-102, describes TC524257P/Z/J-10 and -12 CMO multiport memory with a 262,144-word×4 bit dynamic random access memory (RAM) port and a 512-word×4 bit static serial access memory (SAM) port. As explained at page B-57, these products feature a logic function and a write-per-bit function on the RAM port. Page B-58 shows a block diagram of the products, including memory array, row decoder, column decoder, I/O gate, sense amp, transfer gate, serial register, serial selector, logic operation, and write-per-bit control. FIGS. 2 and 3 and Table 2 on page B-68 illustrate a write-per-bit function that selectively controls the internal write-enable circuits of the RAM port for application to displays. FIGS. 4–6 and Table 3 on pages B-69 through B-71 illustrate a logic function that provides 16 modes of raster operation. As shown in FIG. 4, a logical operation is performed on input data and data in a destination cell and the result is then stored in the destination cell.

SUMMARY OF THE INVENTION

The present invention provides parallel processing circuitry on a substrate. The parallel processing circuitry includes memory elements in row sets and column sets, with each memory element being in a respective row set and a respective column set. The parallel processing circuitry also includes, for each column, processing circuitry for performing operations on data in the column. Each column, including its respective processing circuitry, thus forms a respective processing unit, so that the substrate can have a very large number of processing units. The parallel processing circuitry also includes column transfer means for transferring data to or from the processing unit of any of the columns. The column transfer means includes processing unit connection circuitry connected to each column's processing unit. The parallel processing circuitry can be used as a coprocessor in performing value assignment search for a set of variables, with each processing unit storing data indicating a respective combination of values that could be assigned to the variables.

One aspect of the invention arises from the observation of interrelated problems that limit the number of processing units on a substrate.

A basic problem is that the size of processing units limits the number of processing units on a substrate. Processing unit size depends directly on architecture, and conventional processing units have complex architectures with numerous components. Such architectures seriously limit the number of processing units on a chip.

On the other hand, if a simple processing unit architecture is used, so that a chip can have a large number of processing units, problems arise with the circuitry that transfers data between processing units. Conventional parallel processing architectures require numerous connections among processing units. The number of I/O pads on a chip is limited in proportion to the size of the chip. Therefore, more complicated interconnecting circuitry is required to mitigate the effect of limited I/O pads. Furthermore, the complexity of the interconnecting circuitry increases with the number of processing units, so that design of the circuitry for a large number of processing units is difficult and may not be feasible. Therefore, the circuitry that transfers data between processing units also limits the number of processing units on a chip.

This aspect of the invention is based on the discovery of a technique that alleviates these problems, making it possible to provide high processing unit density on a substrate. This technique is based on the observation that many important computational problems can be handled by simple parallel processing units, each operating on its own data independent of the data of other processing units. For example, the computation can begin with a small number of active processing units, and the number of active processing units can increase as necessary by transferring data from an active processing unit to an inactive one.

Therefore, the problems that limit the number of processing units on a substrate could be alleviated by simplifying the processing units and the circuitry that transfers data between them. The processing units could be specialized for their primary functions of storing and performing operations on data. The circuitry that transfers data could be specialized for its primary function of transferring data to or from processing units. For example, the circuitry could be specialized for transfers from an active processing unit to an inactive processing unit or from a source processing units whose data satisfies some other source criterion to a destination processing unit whose data satisfies some other destination criterion.

This aspect is based on the recognition that conventional random access memory (RAM) chip technology can be used to simplify and specialize processing unit architecture. A conventional RAM chip includes memory elements, each of which can be individually accessed with two items of data—a row identifier and a column identifier. In normal operation, decode circuitry on the RAM chip first decodes the row identifier and selects the identified row; then the circuitry decodes the column identifier and accesses the memory element in the selected row that is in the identified column.

An array of memory elements similar to a RAM chip can provide the memory elements for a very large number of processing units. The memory elements are connected in two orthogonal groupings, arbitrarily called row sets and column sets, or simply rows and columns, by analogy to RAM chip terminology. Each memory element is in one of the rows and one of the columns. For unique access to each memory element, each row and each column could share at most one memory element.

Each column can have respective processing circuitry for performing operations on data, so that each column of memory elements, with its respective processing circuitry, forms a processing unit. Each column's respective processing circuitry is connected so that it can read data from or write data to any memory element in the column.

The parallel processing circuitry can also include column transfer means for transferring data to or from the processing unit of any of the columns. The column transfer means can include processing unit connection circuitry that is connected to each of the processing units. As a result, the processing units need not be fully connected to each other in order to transfer data between processing units on the substrate, greatly simplifying the circuitry interconnecting the processing units.

The processing units can be operated as a single instruction multiple data (SIMD) machine, with all processing units executing the same instruction stream. The processing unit instruction stream and control signals for other components can be provided by a controller, and can be provided directly to the processing units or to control circuitry on the substrate that then provides signals to the processing units.

The processing circuitry for each column can include a temporary memory element. The processing circuitry for each column can also include operation logic connected to receive two items of data—the data in the temporary memory element and the data read from an accessed memory element in the column. Further, the operation logic can be connected to receive commands in response to which it performs logical operations on the data it receives, producing output data. Finally, the operation logic is connected so that its output data can be written to an accessed memory element in the column. The temporary memory element can be connected so that it can store data read from an accessed memory element in the column or so that it can store output data from the operation logic.

The processing circuitry for all of the columns can be implemented in a line along one side of a memory array, the side at which column access lines emerge. The temporary memory elements, the logic, and other components, such as sense amps and drivers, can be aligned to simplify layout.

In addition, the parallel processing circuitry can include row select logic to select a row of memory elements. The row decode circuitry can be implemented along another side of the memory array, the side at which row select lines enter the array. The row select logic can be implemented with conventional row decode logic for decoding row identifiers.

Parallel processing circuitry as described above is especially well suited for computational problems that can be divided into a large number of independent subproblems, each of which requires a relatively small amount of data. An important example of such a problem is searching for an assignment of values to a set of variables consistent with a given set of constraints, a process referred to herein as value assignment search. The parallel processing circuitry can serve as a coprocessor performing value assignment search in response to a host processor. Each processing unit can perform value assignment search operations for a respective combination of values.

Many common and interesting problems can be formulated as value assignment searches, including bin packing, propositional satisfiability, map coloring, many forms of parsing, and many other NP-complete problems. These problems can be defined in terms of a set of variables, also called assumption variables, and a set of rules. Each variable has a finite number of possible values. Each rule determines, based on an assignment of values to a subset of the variables, either the values of other variables or that the assignment of values is inconsistent. For example, in a sentence parsing problem, the variables correspond to ways of parsing fragments of the sentence and the rules ensure that the parse is consistent. Such a problem is solved by finding a complete assignment of values to variables that is consistent with the rules.

Since value assignment search problems are NP-complete, no known algorithm or machine can perform an arbitrarily large value assignment search in polynomial time. On the other hand, serial algorithms such as backtracking and constraint analysis can perform some such searches. Furthermore, as described in copending, coassigned U.S. Pat. application Ser. No. 07/205,125, entitled now issued as U.S. Pat. No. 5,088,048 entitled "Massively Parallel Propositional Reasoning," and incorporated herein by reference ("the Massively Parallel ATMS application"), an assumption-based truth maintenance system (ATMS), which can perform value assignment searches, can be implemented on a highly parallel processor such as the Connection Machine of Thinking Machines Corporation to reduce execution time by orders of magnitude over serial algorithms.

A highly parallel processor, such as the Connection Machine, can perform a value assignment search by handling a number of independent combinations of values in parallel, as described in the Massively Parallel ATMS application. Each combination of values can be handled independently by a respective processing unit, so that the processing units can perform value assignment operations in parallel. This technique reduces the computational cost of many value assignment searches, making such searches feasible where they were not feasible with serial algorithms.

Nonetheless, conventional highly parallel processors such as the Connection Machine do not include enough processing units to handle value assignment searches of moderate complexity without some serialization of processing. This is because moderately complex value assignment searches must consider a very large number of combinations of values. Furthermore, the Connection Machine and other available highly parallel processors are bulky and expensive.

This aspect of the invention is based on the observation that parallel processing circuitry on a substrate can alleviate these problems. Each column of a memory array can have respective processing circuitry for handling a respective combination of values. Data indicating the respective combination of values can be stored in the column's memory elements, each of which can be selected by row select circuitry. Any other data necessary for a search can also be stored in each column's memory elements. Because of the small area of substrate occupied by each column, a highly parallel processor that includes such parallel processing circuitry can include far more processing units than a conventional highly parallel processor and therefore can handle far more combinations of values. A number of substrates could be interconnected to build a compact, inexpensive coprocessor to perform value assignment search.

Several closely related aspects of the invention are based on the observation that the parallel processing circuitry described above requires appropriate circuitry to perform operations that are important to value assignment search. For example, in value assignment search as described in the Massively Parallel ATMS application, it is frequently necessary to divide a value assignment combination into two new independent subcombinations by assigning to a previously unassigned variable each of its possible values, an operation called "forking." To fork, data from an active processing unit is copied to an inactive processing unit in such a way that a previously unassigned variable is assigned one value in the source processing unit and the other value in the destination processing unit when the operation is completed. As a result, the source processing unit handles one subcombination of values and the destination processing unit handles another.

One of these aspects is based on the observation that a conventional column multiplexer to address the columns is not necessary to perform value assignment search and similar operations with the parallel processing circuitry described above because the processing circuitry of all of the columns operates in parallel. Furthermore, it is not necessary for a processing unit to be able to address another specific processing unit because two processing units do not need to communicate while operating on independent data. Nevertheless, for forking in value assignment search and for other similar operations, it is sometimes necessary to transfer data from one processing unit to another. Specifically, forking requires transfer from an active processing unit to an inactive processing unit.

This problem can be solved with circuitry that can select processing units which can then be sources or destinations. Such circuitry can be implemented with processing unit selection logic for selecting any of the processing units. The selection logic can, for example, be implemented as conventional find-first-one logic connected to receive data indicating eligibility for selection from each processing unit.

A closely related aspect follows from the above observation that the effect of a forking operation for a given processing unit depends on whether the processing unit is active or inactive—an active processing unit could be a source whose data is copied while an inactive processing unit could be a destination, as described above. Therefore, a forking operation includes selecting an active processing unit and selecting an inactive processing unit. In addition, control of forking and other operations can also include counting the number of active or inactive processing units or performing an OR operation to determine whether any processing units are active or inactive.

This aspect is based on the observation that forking and other operations can be facilitated by using one of the bits of memory for each processing unit to indicated whether the processing unit is active. As described above, each processing unit performing value assignment search handles a respective combination of values. Therefore, a processing unit is active in value assignment search only if its combination of values has not yet been determined to be inconsistent with the constraints being applied. Such a combination of values is referred to herein as "valid," and the bit of memory used to indicate activity is referred to as the "valid bit," meaning that it indicates whether the processing unit's respective combination of values is valid.

The processor can be operated so that the valid bit is changed only during operations in which a processing unit starts handling a new combination of values, such as initialization and forking, and operations in which a processing unit stops handling a combination of values that is inconsistent, referred to as "killing." In addition, the valid bit can be used when necessary to distinguish valid and invalid combinations of values, such as during forking and during operations that find the results of computation. In general, other operations can be performed without regard to the valid bit—results from an invalid processing unit are ignored.

Other related aspects of the invention are based on the observation that transferring data to or from a processing unit's column in the memory array is relatively slow if the memory cells are read or written one by one in sequence. One solution to this problem is to read and write a processing unit's data in parallel. Another solution is to perform a number of data transfer operations at once.

The solution of reading and writing in parallel can be implemented with a second dimension of access to the memory array. Processing unit select logic can select the memory elements of a processing unit. The memory elements can then be read or written in parallel, along the rows. A temporary column register can be connected so that data read from a processing unit can be stored in it and so that data stored in it can be written to a processing unit. When the processing unit select logic provides a first signal selecting a processing unit as the source for a transfer of data, the selected processing unit's data is read and stored in the temporary column register. When the select logic provides a second signal selecting a processing unit as the destination for a transfer of data, the data from the temporary column register is written into the selected processing unit.

The solution of performing a number of data transfers at once can be implemented with a permutation network interconnecting the processing units. The permutation network can include a plurality of lines, each with switching elements so that it can be set up to transfer data from any of the processing units to any other processing unit. Once the lines are set up, a data transfer can be performed row by row, the transfer for each row using all of the lines that are set up concurrently. As a result, the permutation network can be used to perform a number of copy operations or other transfer operations at once.

Another aspect is based on the observation that value assignment operations may require transfer of data between interconnected substrates, using external connecting circuitry such as I/O pads. This may be necessary during a forking operation, for example, if all the processing units on a first substrate are valid and some of the processing units on a second substrate to which it is connected are invalid—the data of one of the processing units on the first substrate can be transferred to one of the processing units on the second substrate before forking. Other occasions may also arise during value assignment search at which it is convenient to transfer data between processing units and external components.

This problem can be solved with external transfer means for transferring data between the substrate's external connecting circuitry and the circuitry that transfers data between processing units. Therefore, each individual processing unit does not require separate external connections, greatly reducing the number of I/O pads required.

The external transfer means could transfer data between the external connecting circuitry and the column register described above. This could be implemented with an additional column register, connected to the column register and structured as a shift register so that its bits can be serially transmitted through the external connections or loaded from the external connections.

The external transfer means could transfer data between the external connecting circuitry and the permutation network described above. This could be implemented with switching circuitry for connecting the external connecting circuitry to any of the lines of the network so that data can be transferred between the external connections and any of the processing units through the network.

Another closely related aspect is based on the observation of a problem that arises in a forking operation. If a first processing unit's data is simply copied to a second processing unit, both will handle the same combination of values. Therefore, a forking operation cannot end until a previously unassigned variable has been assigned one of its values in the first processing unit and the other of its values in the second processing unit.

This problem can be solved by storing data that indicates which processing units are sources of the forking operation or by storing data that indicates which processing units are destination. In either case, the data can be stored in a bit of the memory array that is not copied or in a temporary memory register that is not otherwise used during the copy operation, so that it is not affected by the copy operation. Then, when the operation is over, the data can be used in a concluding step that ensures that the source and destination processing units have different values assigned for the variable.

The following description, the drawings, and the claims further set forth these and other objects, features, and advantages of the invention.

DETAILED DESCRIPTION

A. Conceptual Framework

Figure 1:
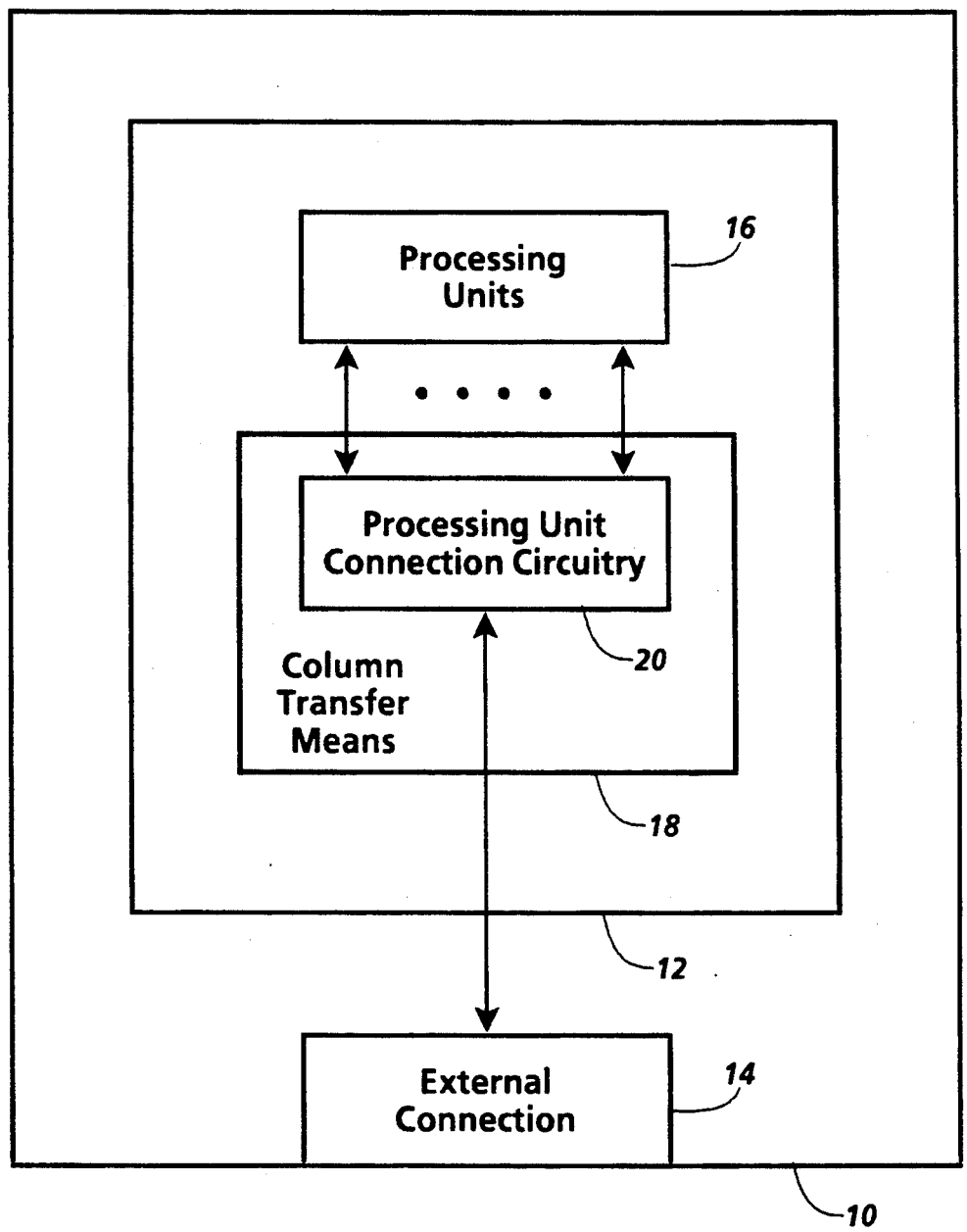
FIG. 1 is a schematic block diagram showing general components of a processor according to the invention.

The following conceptual framework is helpful in understanding the broad scope of the invention, and the terms defined below have the meanings indicated throughout this application, including the claims.

"Data" refers herein to signals that indicate information. When an item of data can indicate one of a number of possible alternatives, the item of data has one of a number of "values." For example, a binary item of data has one of two values, such as "0" and "1" or "ON" and "OFF."

"Circuitry" or a "circuit" is any arrangement of matter that can respond to first data at one location or time by providing second data at another location or time. Circuitry "stores" the first data when it receives the first data at one time and, in response, provides substantially the same data at another time. Circuitry "transfers" the first data when it receives the first data at a first location and, in response, provides substantially the same data at a second location. "Logic" is circuitry that can respond to the first data by providing different data at another location or time. Logic can include circuitry that transfers and stores data. Logic that provides data to be transferred from a first location to a second location "transmits" the data, while logic at the second location "receives" the data.

A "processor" or "processing circuitry" is any combination of circuitry that can perform operations on data. A "processing unit" is a processor. A "parallel processor" is a processor that includes more than one processing unit, each able to perform operations on data in parallel with the others.

A "memory element" is any combination of circuitry that can store data. A "memory cell" is a memory element that can store a single unit of data, such as a bit or other n-ary digit or an analog value. A "register" is a memory element that includes an array of memory cells for temporary storage of data. A "shift register" is a register in which the data stored in all of the memory cells can be shifted along a dimension of the array to the next memory cell. If the array is one-dimensional, the shifting operation can receive and store a series of bits of data or it can provide a series of bits data as output.

An operation "writes" or "sets" a memory element or memory cell by storing data in the memory element or memory cell. An operation "reads" a memory element or memory cell by producing data indicating the value of data stored in the memory element or memory cell. A memory element or memory cell is "selected" by being put into a state in which it can be read or written. The data stored in a memory element or memory cell is "accessed" by being read or written.

An "array" of memory elements is a number of memory elements that are selected or accessed in an interdependent manner. For example, an array can have two dimensions of selection or access, with the memory elements being in sets that are arbitrarily called "row sets" or "rows" and "column sets" or "columns."

A "register" is a number of memory elements that together can store a data value.

A processor "uses" data in performing an operation when the result of the operation depends on the value of the data. An operation "transfers" data from a first memory element or memory cell to a second if the result of the operation is that the data stored in the second memory element or memory cell is the same as the data that was stored in the first memory element or memory cell prior to the operation. An operation "copies" data from a first memory element or memory cell to a second if the operation transfers the data from the first memory element or memory cell to the second and if, after the operation, the data stored in the first memory element or memory cell is the same as the data that was stored there prior to the operation. An operation "modifies" data that indicates one of a number of values when it changes the data to indicate a different one of the values.

Circuitry "decodes" data by receiving the data and by providing respective output data whose value depends on the value of the data received. In other words, there is a mapping between the value of the data received and the value of the output data that results from decoding.

A "substrate" or "chip" is a unit of material that a surface at which circuitry can be formed or mounted. An "integrated circuit" is a circuit formed on a substrate by processes such as etching and deposition.

Any two components of circuitry are "connected" when there is a combination of circuitry that can transfer data from one of the components to the other.

A "lead" is a part of an electrical component at which the component connects electrically to other components. A "line" is a simple conductive component that extends between and connects two or more leads. A lead of an electrical component is "connected" to a lead of another electrical component when there is a conductive electrical connection between them through a combination of leads and lines. In an integrated circuit, leads of two components may also be "connected" by being formed as a single lead that is part of both components.

A "network" is an electrical component that includes a plurality of lines that are connected or that can be connected by operating switching circuitry in the network.

A first component "controls" a second component when signals from the first component determine how the second component operates.

When used in relation to each other, the terms "variable" and "value" have interdependent meanings: A variable can take one of a respective set of possible values. Most of the variables of interest for purpose of the present invention are variables that can take one of two binary values, such as boolean variables that can take either the value TRUE or the value FALSE. For practical purposes, such a variable has a third possible value, referred to herein as a "NULL value" or an "unassigned value," at a time when it has not yet been assigned one of its binary values.

Data indicates a "combination of values" or a "value assignment" for a set of variables by indicating, for each variable, at most one of the variable's possible values.

A "value assignment search" is a process for finding a combination of values that is consistent with a set of constraints applicable to a set of variables. A "value assignment search operation" or "value assignment operation" is an operation performed during a value assignment search.

B. General Features

Figure 2:
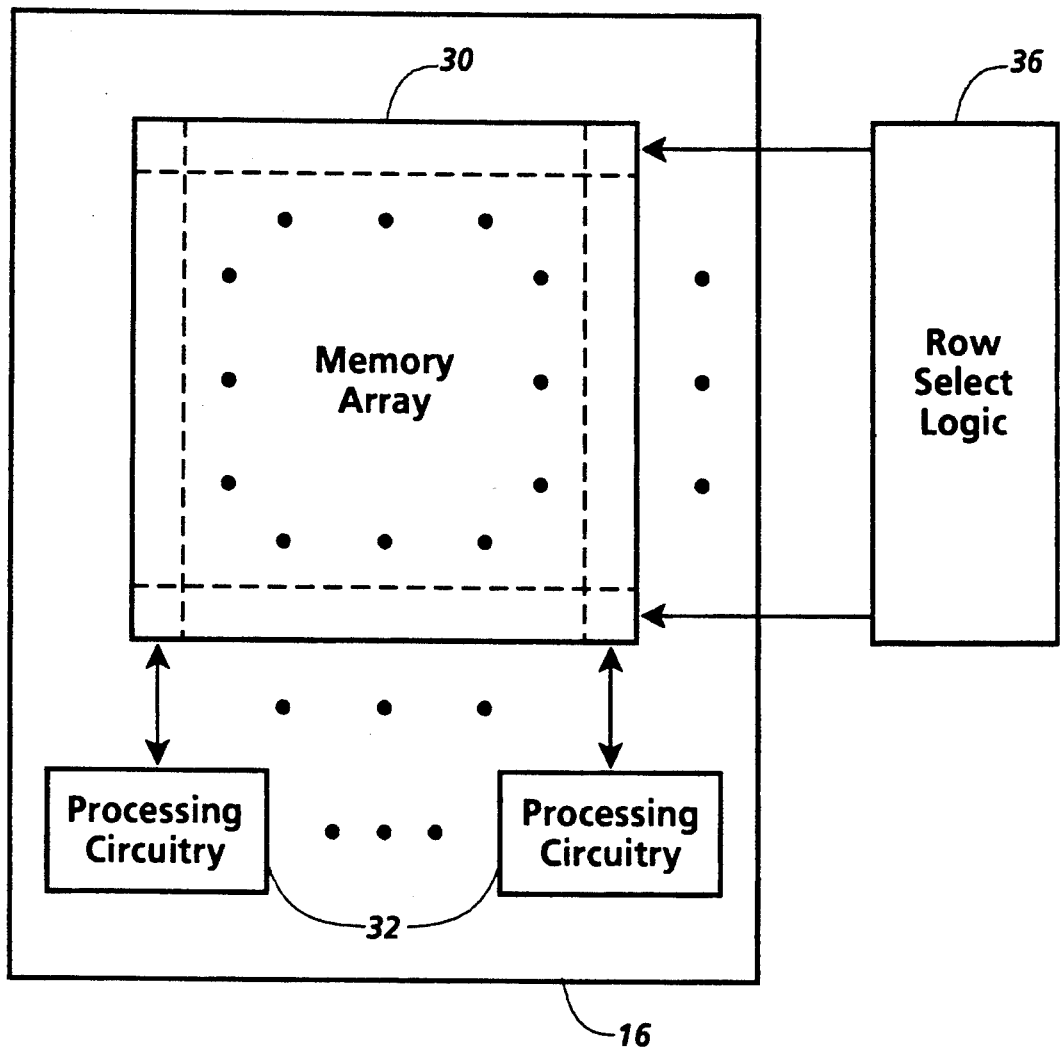
FIG. 2 is a schematic block diagram showing components within the parallel processing circuitry of FIG. 1.
Figure 3A:
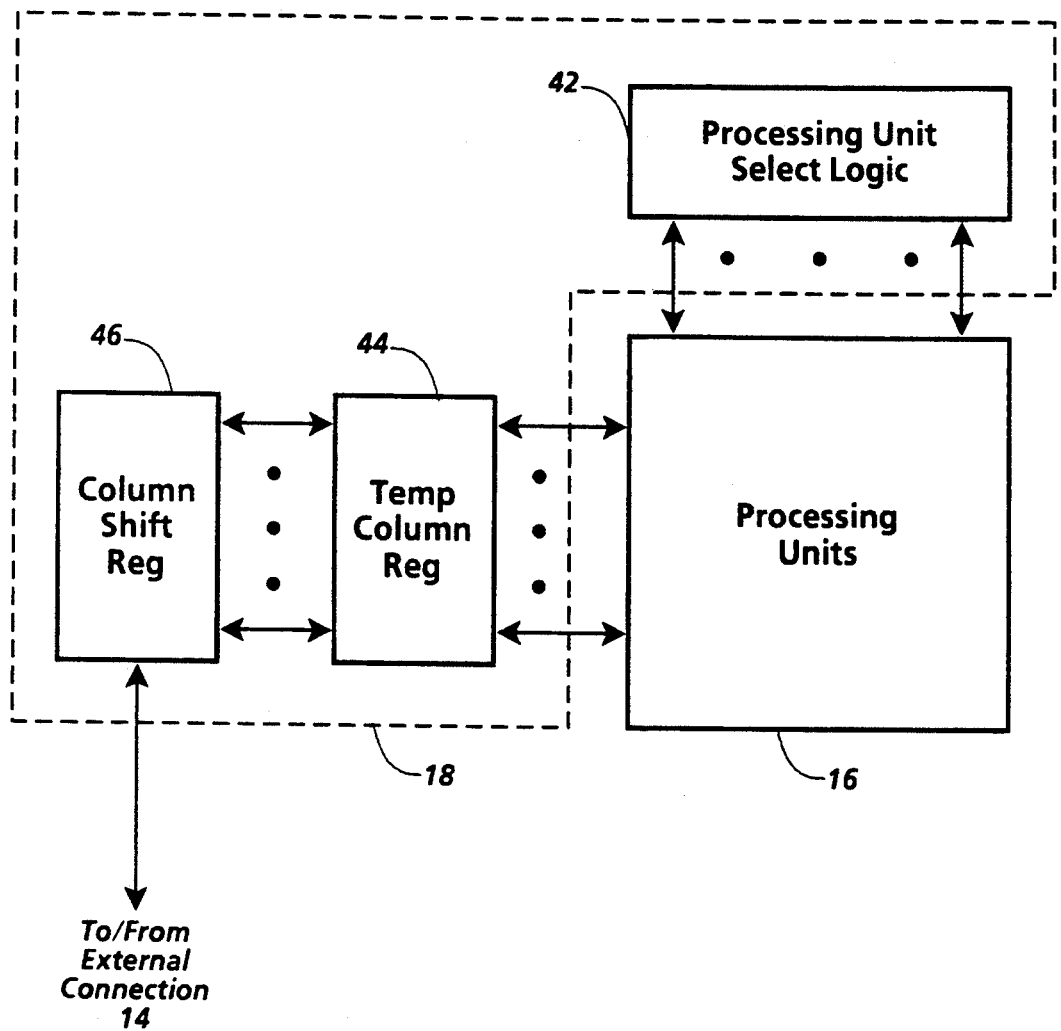
FIG. 3A is a schematic block diagram showing components within the connection circuitry of FIG. 1, including a column register.
Figure 3B:
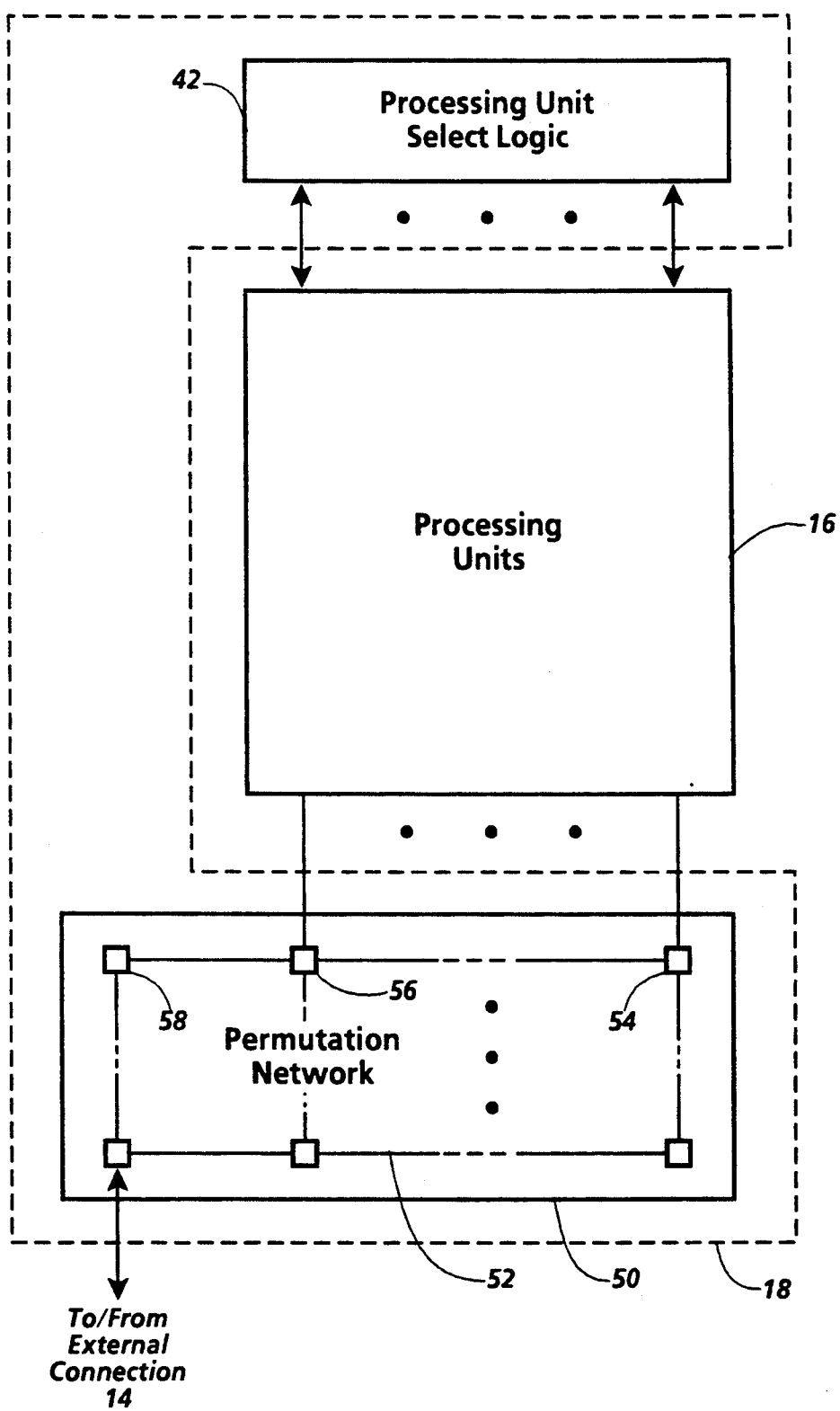
FIG. 3B is a schematic block diagram showing components within the connection circultry of FIG. 1, including a permutation network.
Figure 4A:
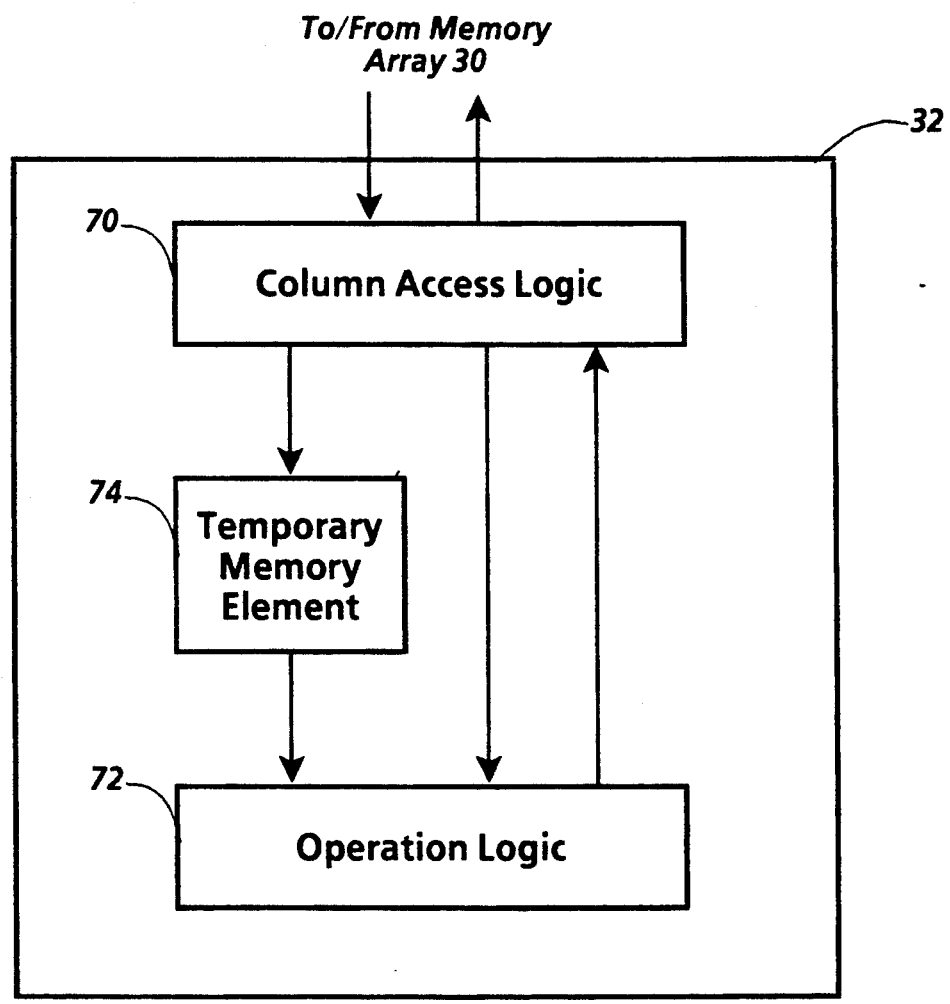
FIGS. 4A, 4B, and 4C are schematic block diagrams, each showing a respective arrangement of components within a processing unit in FIG. 2.
Figure 4B:
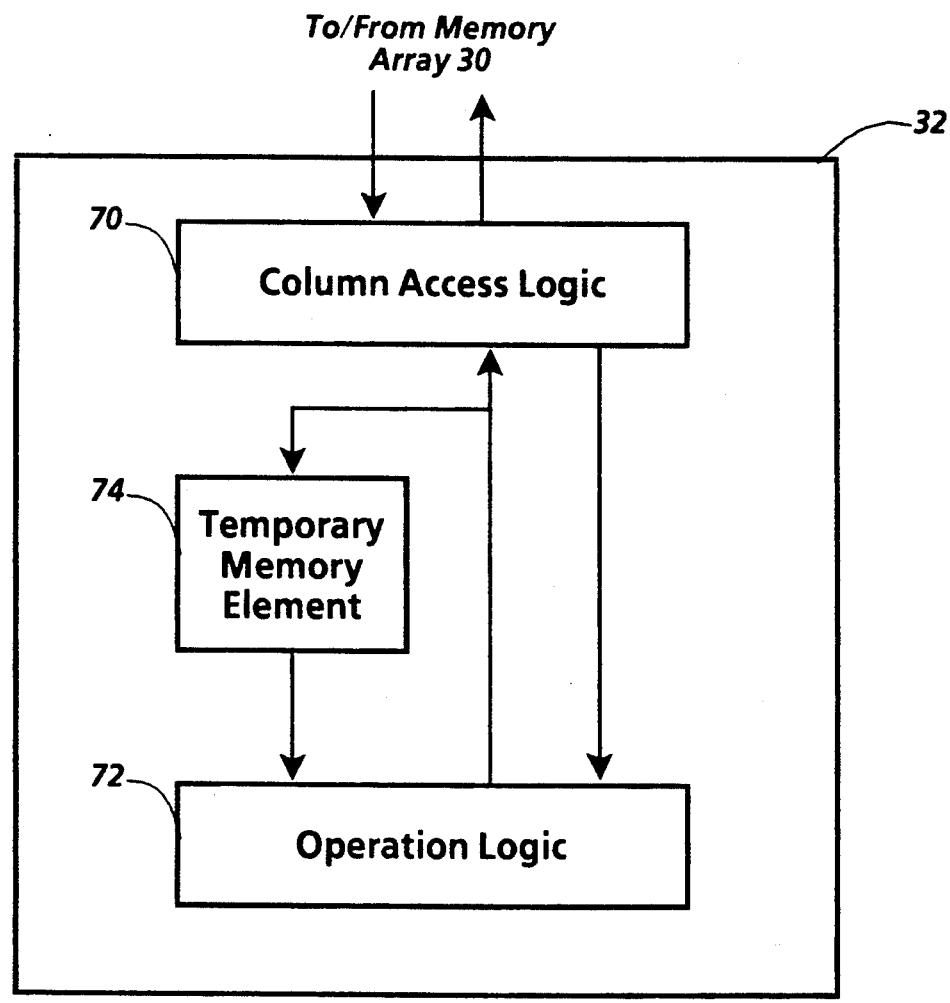
Figure 4C:
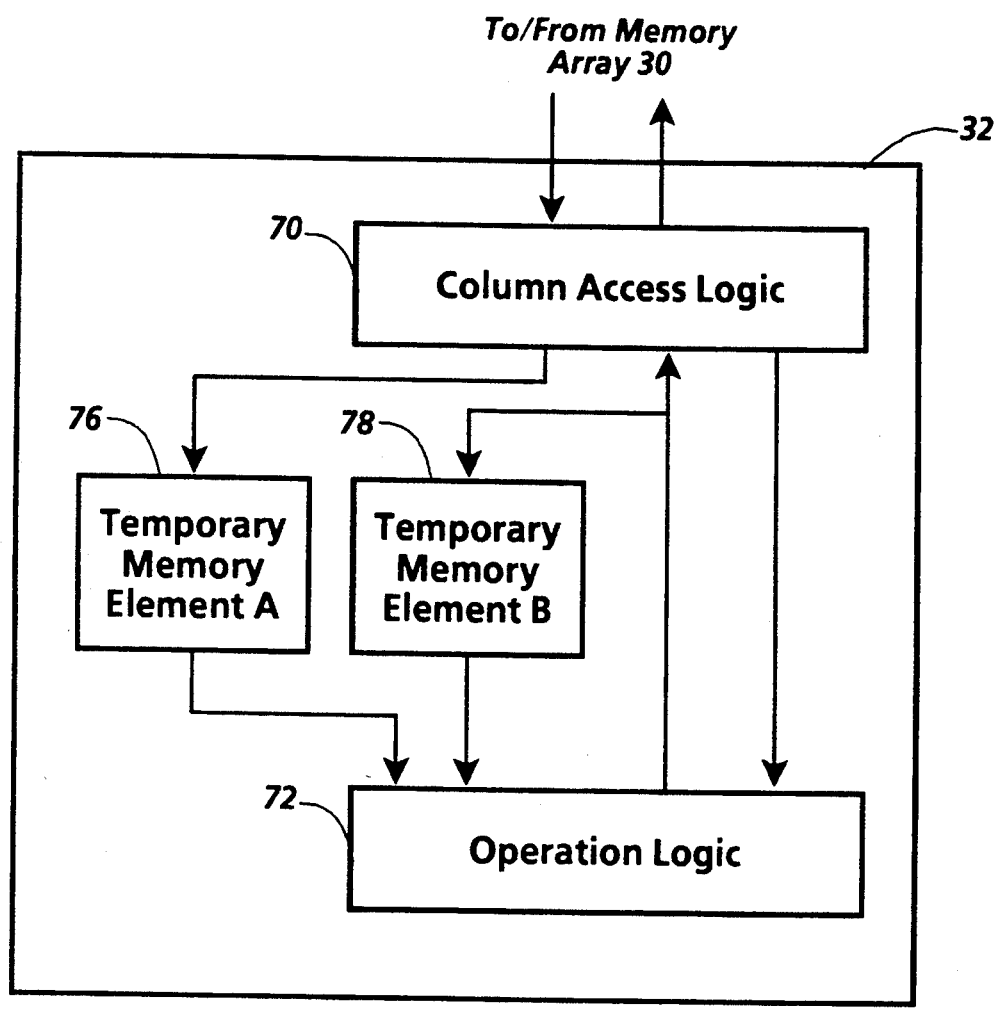
Figure 5:
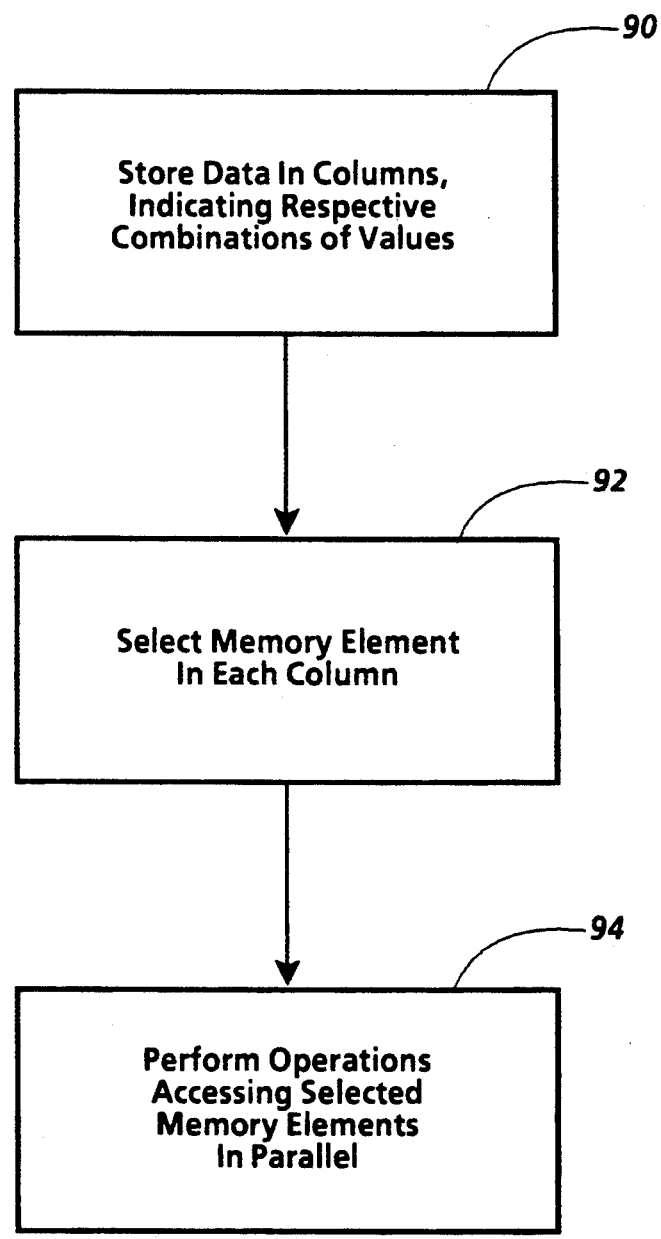
FIG. 5 is a flow chart showing general steps in performing value assignment search on a processor according to the invention.

FIGS. 1–5 illustrate general features of the invention. FIG. 1 shows general components of a processor according to the invention. FIG. 2 shows the processing units of FIG. 1 in more detail. FIG. 3A shows a column register for transferring data between processing units. FIG. 3B shows a permutation network for transferring data between processing units. FIGS. 4A, 4B, and 4C show examples of processing units that can be used in FIG. 2. FIG. 5 shows general steps in operating a processor to perform value assignment search according to the invention.

FIG. 1 shows substrate 10 at the surface of which is parallel processing circuitry 12 and external connection 14. Substrate 10 can be implemented as a semiconductor substrate at the surface of which parallel processing circuitry 12 is formed with conventional VLSI techniques. External connection 14 can be conventional I/O pads or any other means for transferring data to and from components that are not on substrate 10.

Parallel processing circuitry 12 includes processing units 16, each of which includes a column of memory, and column transfer means 18 for transferring data to and from the processing unit of any column. Column transfer means 18 includes processing unit connection circuitry 20. As shown, there are many lines between processing unit connection circuitry 20 and processing units 16 because there are many processing units; processing unit connection circuitry 20 can be connected to each of the processing units. In comparison, the number of lines between external connection 14 and processing unit connection circuitry 20 is relatively small. Substrate 10 can also have an instruction bus or other lines (not shown) for providing instructions received through external connection 14 directly to processing units 16 or to other circuitry such as a decoder.

FIG. 2 shows components that form processing units 16. Memory array 30 includes memory elements, each in a row set and a column set. Memory array 30 can therefore be implemented with conventional RAM memory techniques, with slight modifications as described below. The rows are shown extending horizontally and the columns are shown extending vertically.

Each column of memory array 30 has respective processing circuitry 32. In addition, parallel processing circuitry 12 includes row select logic 36 for selecting any of the rows of memory elements. Each column's respective processing circuitry 32 can access the memory element in its column which is selected by row select logic 36. The respective processing circuitry 32 can read data from a memory element or write data to a memory element. Each column of memory elements and its respective processing circuitry 32 thus form a respective processing unit that can operate in parallel with other processing units.

FIGS. 3A and 3B each show general components of column transfer means 18 that can transfer data to and from any of processing units 16. FIG. 3A shows components for transferring a processing unit's data in parallel and FIG. 3B shows components for making a number of serial transfers concurrently. In both FIGS. 3A and 3B, column transfer means 18 also includes processing unit selection logic 42 for selecting any one of processing units 16.

In FIG. 3A, temporary column register 44 can be used to transfer a processing unit's data in parallel. Specifically, a selected processing unit's data can be read into temporary column register 44. Also, data from temporary column register 44 can be written into a selected processing unit. Therefore, a copy operation can be performed on an entire column by a sequence of steps: First, processing unit select logic selects a first processing unit as the source of the copy operation. The first processing unit's data is read and stored in temporary column register 44. Then, processing unit select logic selects a second processing unit as the destination of the copy operation. The data from temporary column register 44 is then written into the second processing unit.

FIG. 3A also shows how this approach can be extended to transfers of data to or from external connection 14. Column shift register 46 is connected so that it can be loaded with data read from a processing unit and stored in temporary column register 44; column shift register 46 can then provide its bits in series to external connection 14. Column shift register 46 is also connected so that it can be loaded with a series of bits from external connection 14; this data can then be transferred to temporary column register 44 for writing to a processing unit.

In FIG. 3B, permutation network 50 can be used to make a number of serial transfers concurrently. Each of connecting lines 52 can handle one serial transfer, so that permutation network 50 can make as many concurrent transfers as the number of connecting lines 52. Each processing unit can be connected to each of connecting lines 52 through a switching element, such as switching elements 54 and 56. This approach can also be extended to external transfers by structuring permutation network 50 so that external connection 14 can be connected to each of connecting lines 52 through a switching element, such as switching element 58.

FIGS. 4A, 4B, and 4C show three simple examples of components within processing circuitry 32 for one of the columns of memory array 30, with equivalent components having the same reference numbers. These examples illustrate some of the many possible structures of processing circuitry 32.

In FIGS. 4A, 4B, and 4C, column access logic 70 is connected for writing data to the memory elements in the column and for reading data from the memory elements in the column. Column access logic 70 can be implemented with a conventional sensing amplifier and driver.

In FIGS. 4A and 4B, operation logic 72 is connected to receive data from column access logic 70 or from temporary memory element 74, which could be implemented as a conventional flip-flop. Operation logic 72 can perform an operation on the data from temporary memory element 74 and from column access logic 70 to produce output data. In FIG. 4A, the output data is provided to column access logic 70 for writing to a memory element in the column; temporary memory element 74 is also connected to receive data from column access logic 70. In FIG. 4B on the other hand, the output data from operation logic 72 is provided both to column access logic 70 for writing and also to temporary memory element 74.

FIG. 4C includes both temporary memory element A 76, connected as in FIG. 4A, and temporary memory element B 78, connected as in FIG. 4B. Operation logic 72 is connected to receive from both temporary memory elements and therefore performs operations that have three operands instead of two as in FIGS. 4A and 4B. The structure of FIG. 4C could be extended by adding additional temporary elements.

FIG. 5 shows general steps that can be performed by parallel processing circuitry 12 in performing a value assignment search operation for a set of variables. In the step in box 90, data is stored in a set of the columns in memory array 30. The data in each column indicates a respective combination of values, with each combination including at most one value for each variable. The step in box 90 could be performed in various ways. For example, internal transfer logic 50 could copy data indicating a combination of values from a first processing unit to a second processing unit; then the respective processing circuitry 32 of the first and second processing units could change the data at each processing unit to indicate a respective subcombination of values, dividing the combination into two subcombinations.

In the step in box 92, row select logic 36 selects a memory element in each column of memory array 30. In the step in box 94, each column's respective processing circuitry performs operations that include accessing the selected memory elements. These operations are performed in parallel.

C. Value Assignment Search

As illustrated by FIG. 5, the invention is especially useful in performing value assignment search. The following description of value assignment search is helpful in understanding the implementations described below.

The computation necessary to solve a value assignment search problem can be analyzed into a few conceptually simple functions. These functions include initializing, making choices, checking constraints, and accumulating results. For example, to find combinations of positions at which eight non-attacking queens can be placed on a chessboard, these functions could be performed as follows: Initializing clears the board; making a choice places a queen in a position on the board; checking a constraint determines whether any two queens can attack each other; and accumulating results counts and returns the possible solutions.

Figure 6:
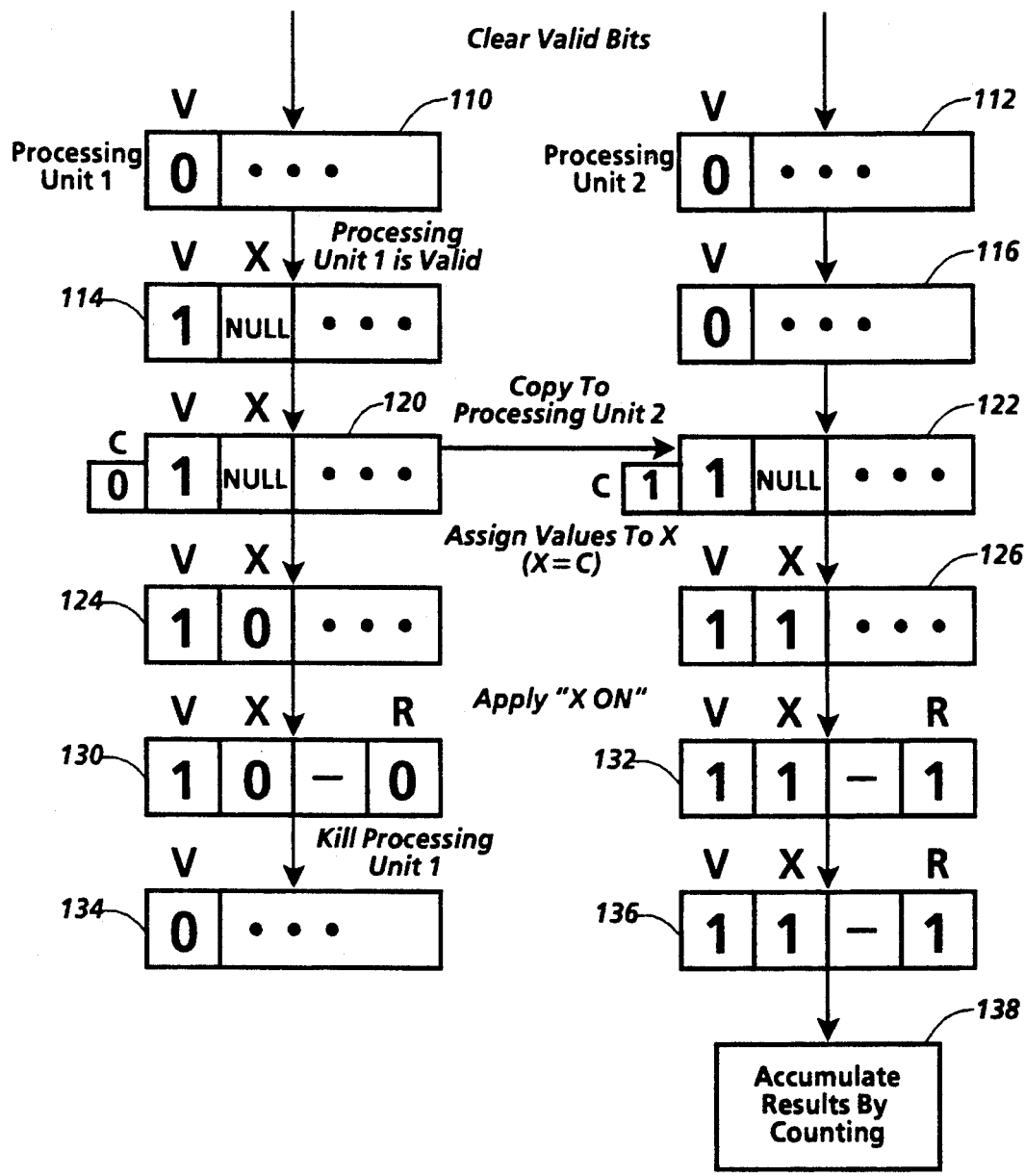
FIG. 6 is a schematic flow diagram showing the data of two processing units at several stages of value assignment search.

Basic operations to implement the functions necessary for parallel value assignment search can be identified by considering how a search could be performed with a number of parallel processing units. FIG. 6 shows an extremely simple example with two parallel processing units, the left column showing the data of a first processing unit and the right column showing the data of a second.

At the first stage shown in boxes 110 and 112 in FIG. 6, both processing units have a field labeled "V" that is cleared, meaning that both processing units are invalid. For purposes of value assignment search, a "valid" processing unit can be defined as a processing unit whose combination of values could be consistent with the constraints being applied; therefore, a valid processing unit's combination of values could lead to a solution of the value assignment search problem. A processing unit that is not currently handling a combination of values or whose combination of values is inconsistent with the constraints is "invalid." Each processing unit can therefore have a single "valid bit" indicating whether it is valid or invalid as shown in FIG. 6. In order to insure that the valid bit is correct, value assignment search operations should only change the valid bit during an operation such as initialization, forking, or killing, and not during other operations. In general, invalid processing units are available to handle new subcombinations of values.

A value assignment search begins with only one combination of variable values, typically the null combination in which all variables are unassigned. Since none of the processing units has previously been active, the initializing function can clear the V bits of the processing units to indicate that they are invalid, as shown in boxes 110 and 112 in FIG. 6. The initializing function can then select one processing unit from all the processing units to be the initial valid processing unit, and can then load appropriate data into the initial valid processing unit and set its V bit. As shown in boxes 114 and 116, the initializing function has made the first processing unit the initial valid processing unit and has set up a field for the value of a variable "X", which initially has the NULL value since a value has not yet been assigned. The "X" field must have at least two bits because it can take any of three values—NULL, 1, and 0.

To implement the function of making a choice between the values of a variable, all of the alternatives can be handled in parallel, with each alternative handled by a respective processing unit. In contrast, a conventional serial search chooses one alternative and later backtracks, when the chosen alternative is fully explored, to consider the other alternatives. To handle all alternatives in parallel, it is typically necessary to split a combination of values handled by one processing unit into two subcombinations, each handled by a respective processing unit. This makes backtracking unnecessary because a processing unit whose combination of values violates a constraint can simply terminate—other processing units are concurrently handling the other alternatives.

The operation of splitting a combination of values into two subcombinations is called "forking". A fork operation determines which valid processing units to fork; sometimes a valid processing unit does not need forking because only one of the subcombinations of values that would result from forking is compatible with its current combination of values. The operation also pairs each valid processing unit to be forked with another, invalid processing unit and copies the data of each processing unit to be forked into its paired invalid processing unit. To complete the forking operation, the data of one or both processing units may be modified to indicate the two subcombinations of values resulting from forking.

A forking operation is shown in two stages in FIG. 6. In the first stage, in boxes 120 and 122, the second processing unit is selected from all the invalid processing units to be paired with the first processing unit, and the data of the first processing unit is copied to the second processing units. In addition, a bit of data, shown as the "C" bit, is saved for use in the second stage of forking. Then, in the second stage, in boxes 124 and 126, values are assigned to the variable X in the first and second processing units so that each is handling a respective subcombination of values.

In FIG. 6, each processing unit's value of the C bit indicates whether the processing unit was the destination of the copy operation. Alternatively, the C bit could indicate whether the processing unit was the source. The C bit cannot be obtained simply by copying or taking the complement of the valid bit, because some of the valid processing units are not forked and some of the invalid processing units do not receive forked data. The C bit could be a bit in the memory array that is not copied or it could be a bit in a temporary memory element.

In the second stage of the forking operation in FIG. 6, the values are assigned to variable X by making the X field take the value of the C bit. Various other techniques could be used. For example, before the copy operation, one value could be assigned to the variable X in all the source processing units, and the value could be changed after the copy operation, either in the source processing units or in the destination processing units.

The function of checking constraints can be implemented by performing a logical or arithmetic operation, either using a subset of a processing unit's combination of values to obtain consequences or using a subset of the values and consequences to determine whether a constraint is satisfied for the processing unit's combination of values. A constraint checking operation thus performs a logical or arithmetic operation using the contents of a processing unit's memory and writes the result into the memory, from which it can be read for further processing.

Constraint checking may determine that a processing unit's combination of values is inconsistent. Therefore, a constraint checking operation may invalidate a previously valid processing unit that obtains a consequence indicating inconsistency. A "kill" operation terminates a processing unit by clearing its valid bit.

Constraint checking is illustrated in two stages in FIG. 6. In the first stage, in boxes 130 and 132, the constraint "X ON" is applied in each processing unit, meaning that the variable X must have the value of 1. This constraint can be applied by copying the value of variable X into the "R" field, whose value indicates the results of applying the constraint and which could be stored in a temporary memory element. As shown, R is 0 for the first processing unit because it has a value of 0 for variable X, but R is 1 for the second processing unit because it has a value of 1.

In the second stage, in boxes 134 and 136, a kill operation is performed by copying the value from the R field into the V bit of each valid processing unit, killing the first processing unit. The second processing unit remains valid because its combination of values is consistent with the constraint that was applied.

The kill operation is vital because the number of active processing units needed for value assignment search would otherwise grow exponentially, rapidly consuming all available processing units. Quickly killing as many valid processing units as possible prevents this, and the best strategy is usually to do as much constraint checking as possible before each fork operation so that as many processing units as possible are killed. To assist in reducing the number of processing units required, a count operation can be performed to count the number of valid or invalid processing units to determine how many processing units are invalid; based on this information, a fork operation can be chosen which requires the smallest number of additional processing units.

The function of accumulating results can be performed after all choices have been made and all constraints checked. Any processing unit that is still valid is then storing data defining a solution of the variable assignment search. An example is shown in box 136 in FIG. 6. For an overall determination of whether there are any solutions, a count operation could count the number of valid processing units; if there is at least one, there is a solution. A logical or arithmetic operation could be used to set a results field in all valid processing units with solutions that meet a criterion. The count operation can then be performed on the results field to determine whether any processing units have solutions that meet the criterion, as shown in box 138 in FIG. 6.

A parallel value assignment search thus requires four basic operations: The calculate operation performs a logical or arithmetic operation using a subset of the data of a processing unit and stores the result; this operation can also be used to move data within a processing unit, to set data during initialization, to change a processing unit's valid bit to make it valid during initialization or forking or to make it invalid when it is killed, to determine whether a processing unit requires forking, to change data in the processing units during forking, and to identify a processing unit that has a specific solution during results accumulation. The select operation selects a processing unit, and can be used to initialization to select the initial valid processing unit during initialization or during a copy operation to select the source and destination, such as during a fork operation. The copy operation copies the data of one processing unit into another processing unit; when used during forking, it can include saving a bit of data to indicate which processing units are sources or which are destinations. The count operation counts the number of processing units with specific data, and is useful to obtain results during accumulation of results and to determine the number of invalid processing units available during forking. Also, the count operation can be used during constraint checking; if only a few processing units would participate in the application of a constraint, it may not be worthwhile to apply the constraint. Together, these operations are sufficient to perform value assignment search.

D. Implementations

The general features described in relation to FIGS. 1-6 could be implemented in many ways. Various substrates could be used, various techniques for forming circuitry at the surface of a substrate could be used, and various types of digital logic could be used. The following description is applicable to any available combination of substrate, processing technology, and logic that is capable of providing an integrated circuit, except where specifically otherwise noted, and is one example of how the general features could be implemented.

1. Calculate Operation

Figure 7:
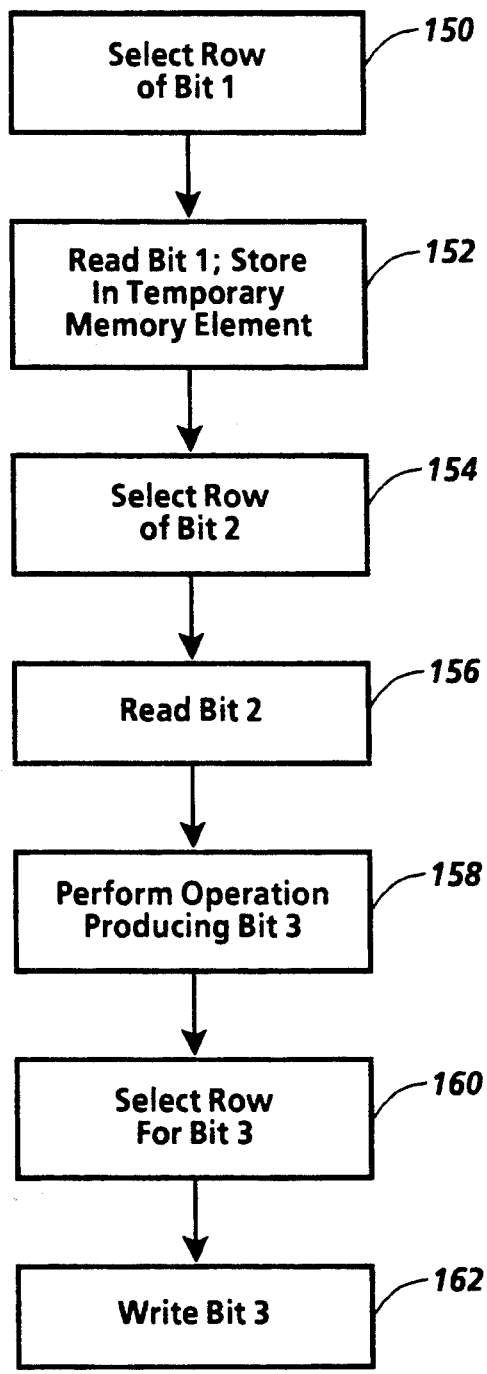
FIG. 7 is a flow chart showing steps in a calculate operation.
Figure 8:
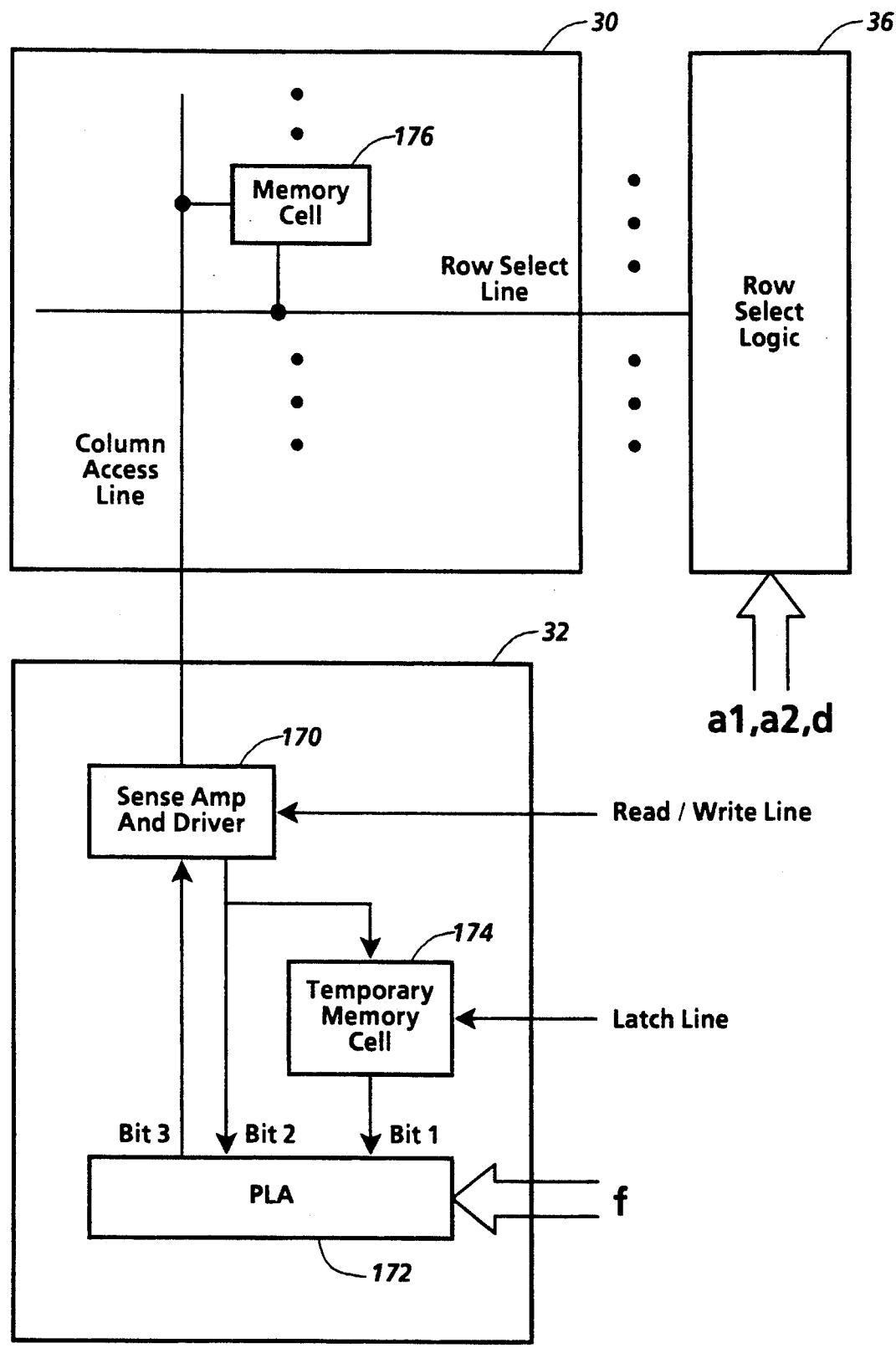
FIG. 8 is a schematic block diagram showing components involved in the calculate operation of FIG. 7.

FIG. 7 shows general steps is performing a calculate operation using processing circuitry like that in FIG. 4A. FIG. 8 illustrates control lines that can be used to produce the general steps in FIG. 7.

Each calculate operation can be performed with the steps in FIG. 7, or similar steps appropriate to the processing circuitry being used. The step in box 150 begins the operation by controlling row select logic 36 to select the row of memory array 30 in which a first argument, Bit1, is stored. The step in box 152 controls column access logic 70 in each processing unit to read Bit1 from the selected memory element and then controls column access logic 70 and temporary memory element 74 so that Bit1 is stored in temporary memory element 74 and is provided to an input of operation logic 72.

The step in box 154 continues by controlling row select logic 36 to select the row of memory array 30 in which a second argument, Bit2, is stored. The step in box 156 controls column access logic 70 in each processing unit to read Bit2 from the selected memory element. Bit2 can then be latched so that it is provided at another input of operation logic 72.

The step in box 158 controls operation logic 72 in each processing unit to perform an operation on Bit1 and Bit2, producing output data Bit3, which can then be latched to column access logic 70. Operation logic 72 could be a PLA, ROM, or other suitable component that can provide a single output bit in response to the two arguments Bit1 and Bit2 and a function code specifying a function of two arguments. The function code could, for example, be a four-bit code specifying one of the sixteen boolean functions of two arguments. With this approach, any arbitrary function with an unlimited number of arguments can be performed through an equivalent sequence of simple functions of two arguments, provided the memory of each processing unit is sufficient to store the arguments and the intermediate and final results.

The step in box 160 then controls row select logic 36 to select the row of memory array 30 in which Bit3 is to be stored. The step in box 162 controls column access logic 70 in each processing unit to write Bit3 to the selected memory element, completing the operation.

Control circuitry within parallel processing circuitry 12 can thus produce a calculate operation by providing control signals to row select logic 36, column access logic 70, temporary memory element 74, and operation logic 72. The control circuitry can provide these control signals in response to a command of the form:

CalculateOpCode(d, f, a1, a2), where a1 and a2 specify the rows in which Bit1 and Bit2 are stored, f specifies one of the sixteen boolean functions of two arguments, and d specifies the row in which Bit3 is to be stored. The control signals can be provided concurrently to all processing units using the control lines shown in FIG. 8.

FIG. 8 shows sense amp and driver 170 implementing column access logic 70, PLA 172 implementing operation logic 72, and temporary memory cell 174 implementing temporary memory element 74. Memory cell 176 in memory array 30 is just one of the memory elements in a column, but illustrates how each memory element could be structured. As shown, the control circuitry can provide any of the row addresses a1, a2, or d to row select logic 36 to control it to select the respective row's row select line. The control circuitry can then provide a signal on a read/write line to control sense amp and driver 170 to read or write the selected memory cell. If Bit1 has been read, the control circuitry can provide a signal on a latch line to control temporary memory cell 174 to store Bit1. If Bit2 has been read, the control circuitry can provide f to PLA 172 to cause it to perform the appropriate boolean function of two arguments to produce Bit3.

The same control signals can be sent in parallel to all the processing units. Because each processing unit has different stored data, it will produce different data than other processing units. The temporary memory cells and other components of the processing units can be aligned for efficient positioning of the control lines.

The most frequent operation is ordinarily a conjunction of input bits. For example, a typical logical operation might be: "p1←a1 AND a2 AND p2" where a1 and a2 are assumptions and p2 is a previously calculated proposition, each at a respective position in each processing unit's memory. This operation can be performed by allocating a location to p1 and a temporary location t1 in each processing unit's memory and by then providing two calculate commands:

CalculateOpCode(t1, AND, a1, a2);

CalculateOpCode(p1, AND, t1, p2), where AND indicates the function code for an AND operation. The first command reads the two assumption bits a1 and a2, ANDs them, and writes the result in t1. The second command reads t1 and p2, ANDs them, and stores the result in p1.

Sometimes, general calculations on data in each processing unit's memory may be needed. For example, to perform the knapsack problem, numbers are added and then compared to a fixed value. If the sum exceeds the fixed value, the combination is ruled out and the processing unit becomes invalid. In the following example, two numbers i1 and i2, each two bits long, are the sources of a sum operation, and i3, a three bit integer, is the result. The bits of i1, i2, and i3 are indicated by i1<0>, i1<1>, i2<0>, i2<1>, i3<0>, i3<1> and i3<2>.

CalculateOpCode(i3<0>, XOR, i1<0>, i2<0>);

CalculateOpCode(t1, AND, i1<0>, i2<0>);

CalculateOpCode(i3<1>, XOR, i1<1>, t1);

CalculateOpCode(t1, AND, i1<1>, t1);

CalculateOpCode(i3<2>, AND, i3<1>, i2<1>);

CalculateOpCode(i3<1>, XOR, i3<1>, i2<1>);

CalculateOpCode(i3<2>, OR, i3<2>, t1), where XOR and OR, like AND, indicate the respective function codes.

2. Select Operation

Figure 9:
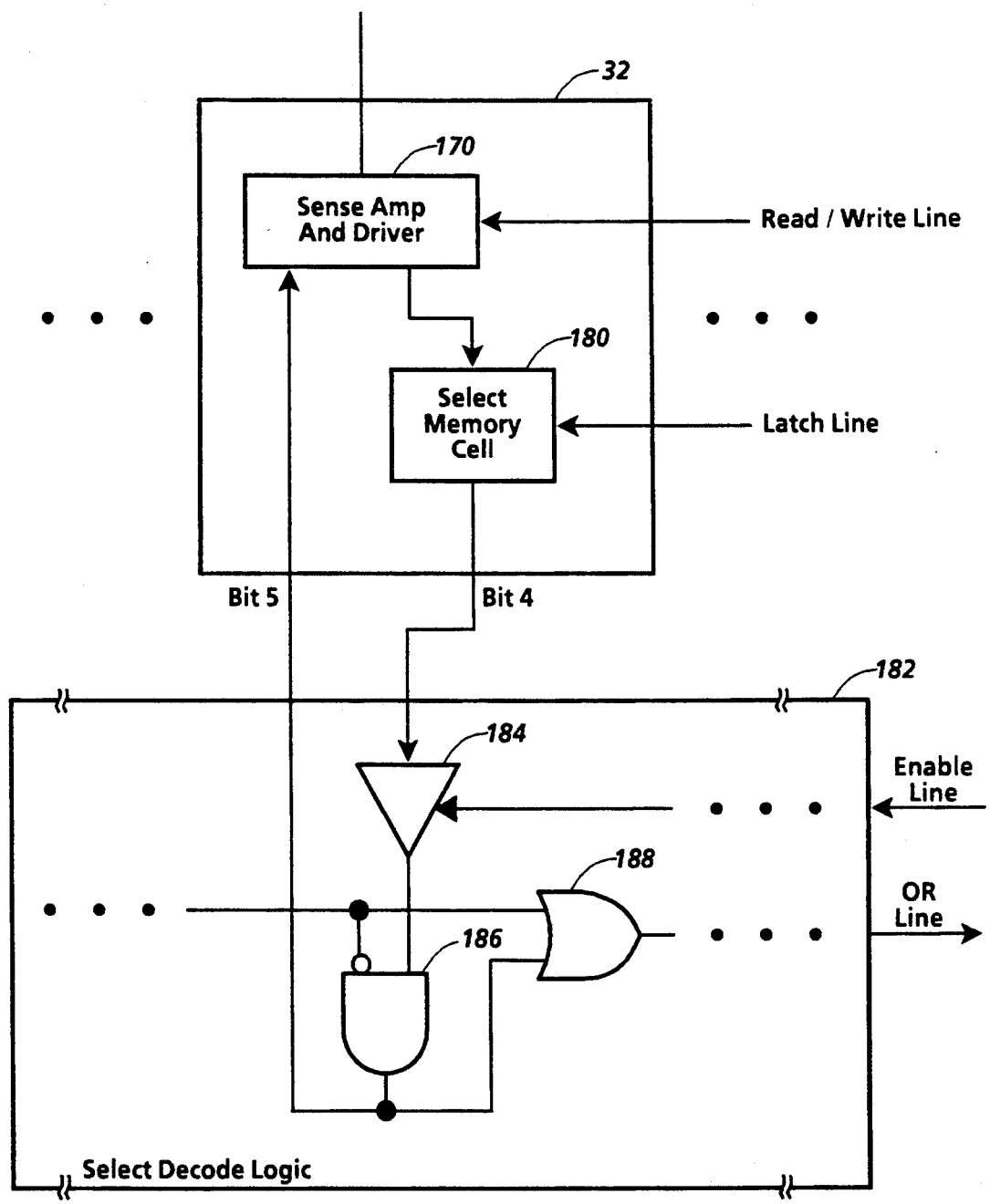
FIG. 9 is a schematic block diagram showing components involved in a select operation.
Figure 10:
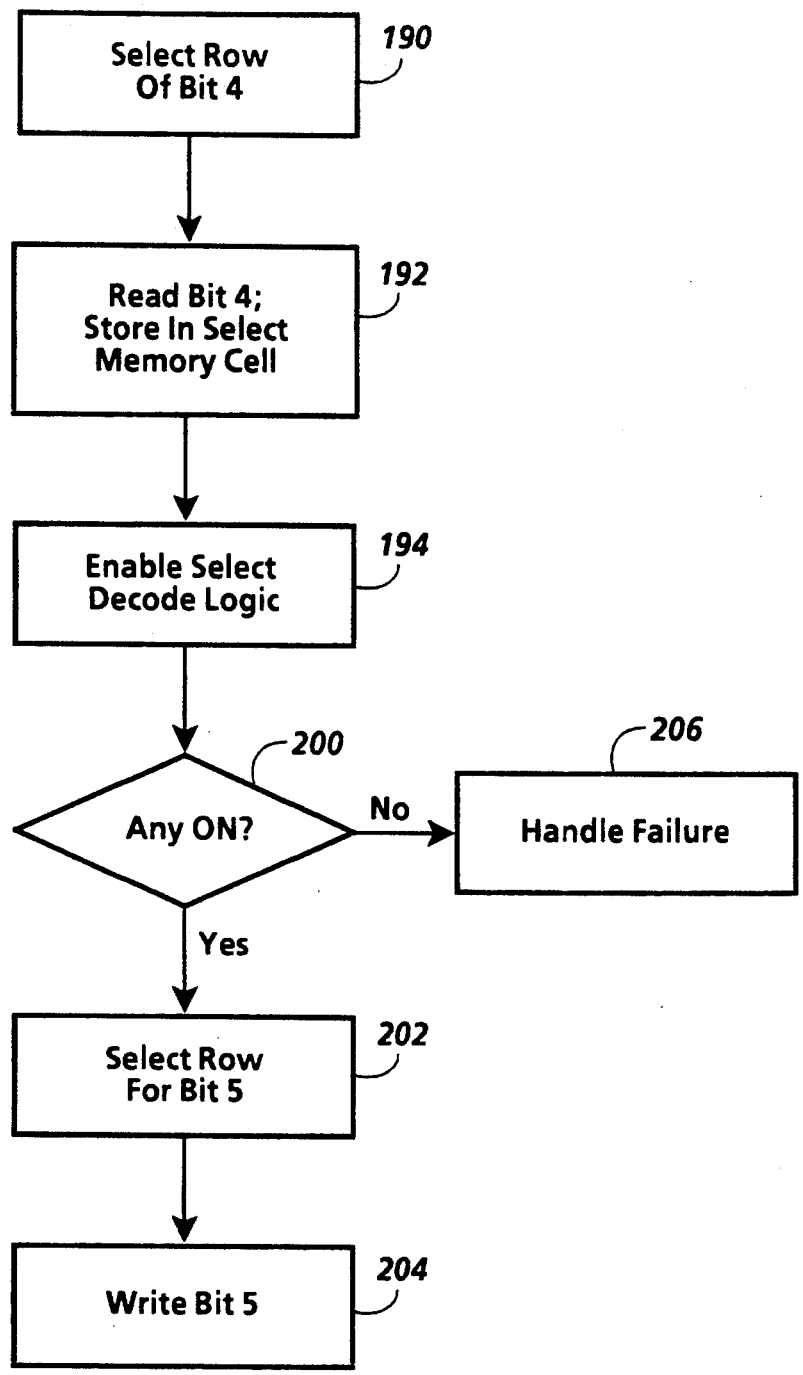
FIG. 10 is a flow chart showing steps in a select operation using the components of FIG. 9.

FIG. 9 shows circuitry that can perform a select operation. FIG. 10 shows steps in a select operation using the circuitry of FIG. 9.

As shown in FIG. 9, each processing unit includes select memory cell 180 which can be the same cell as temporary memory cell 174. Parallel processing circuitry 12 also includes select decode logic 182 which is connected to each processing unit to receive data from select memory cell 180 and to provide a value Bit4 to sense amp and driver 170. Select decode logic 182, which performs a find-first-one function, has N input lines and, for each input, a respective output line. In response to an input combination that includes at least one ON input line, select decode logic 182 provides an ON on the respective output line of exactly one of the ON input lines. For example, select decode logic 182 could be implemented as a daisy chain as shown, in which the enable line activates tristate device 184 to provide Bit4 from select memory cell 180 to AND gate 186, which is also receiving an inverted OR bit indicating whether any of the select memory cells to the left has provided an ON value. If none of the leftward select memory cells have provided an ON value and if Bit4 is ON, then an ON value is provided to sense amp and driver 170 as Bit5. This ON value is also provided to OR gate 188, so that the OR line goes ON for rightward processing units. Select decode logic 182 could alternatively indicate the presence of at least one ON input line by ORing all the input lines.

The select operation in FIG. 10 begins after any necessary calculate operations have been performed to produce a bit for each processing unit indicating whether it is one of the processing units from which a selection can be made. For example, the activity bit could be used to select from all active processing units or a stored bit that is the inverse of the activity bit could be used to select from all inactive processing units.

The bit that indicates eligibility for selection is Bit4, and the step in box 190 provides an address to row select logic 36 so that it selects the row of memory elements in which Bit4 is stored. The step in box 192 then provides a signal to sense amp and driver 170 on the read/write line to read Bit4. A signal on the latch line to select memory cell 180 causes it to store Bit4. Then the step in box 194 provides an enable signal to select decode logic 182, causing it to provide its decoded outputs.

The step in box 200 tests the OR line to determine whether any processing unit's Bit4 is ON. If so, the step in box 202 provides an address to row select logic 36 so that it selects the row of memory elements in which Bit5 is to be stored. The step in box 204 then writes Bit5 to the selected memory element. But if none of the processing units has Bit4 ON, the step in box 206 handles the failure to select with appropriate additional steps that depend on the purpose of selection.

When a select operation has been successfully performed, one and only one processing unit has Bit5 ON, indicating that it is a selected processing unit. After a select operation, subsequent operations that depend on Bit5 being ON are only performed by the selected processing unit. Multiple select operations can be performed to select a number of processing units for operations involving more than one processing unit.

3. Copy Operations

Copy operations include both copying between processing units on the same substrate, such as during forking, and also copying between processing units on different substrates, such as during an operation to balance the number of valid processing units on substrates. Both types of copy operations can be implemented with either transfer technique described above in relation to FIGS. 3A and 3B. Some features of copying between processing units on different substrates are described in copending coassigned U.S. patent application Ser. No. 07/629,732 entitled "Transferring a Processing Unit's Data Between Substrates in a Parallel Processor" and incorporated herein by reference ("the intersubstrate transfer application").

a. Column Registers

Figure 11:
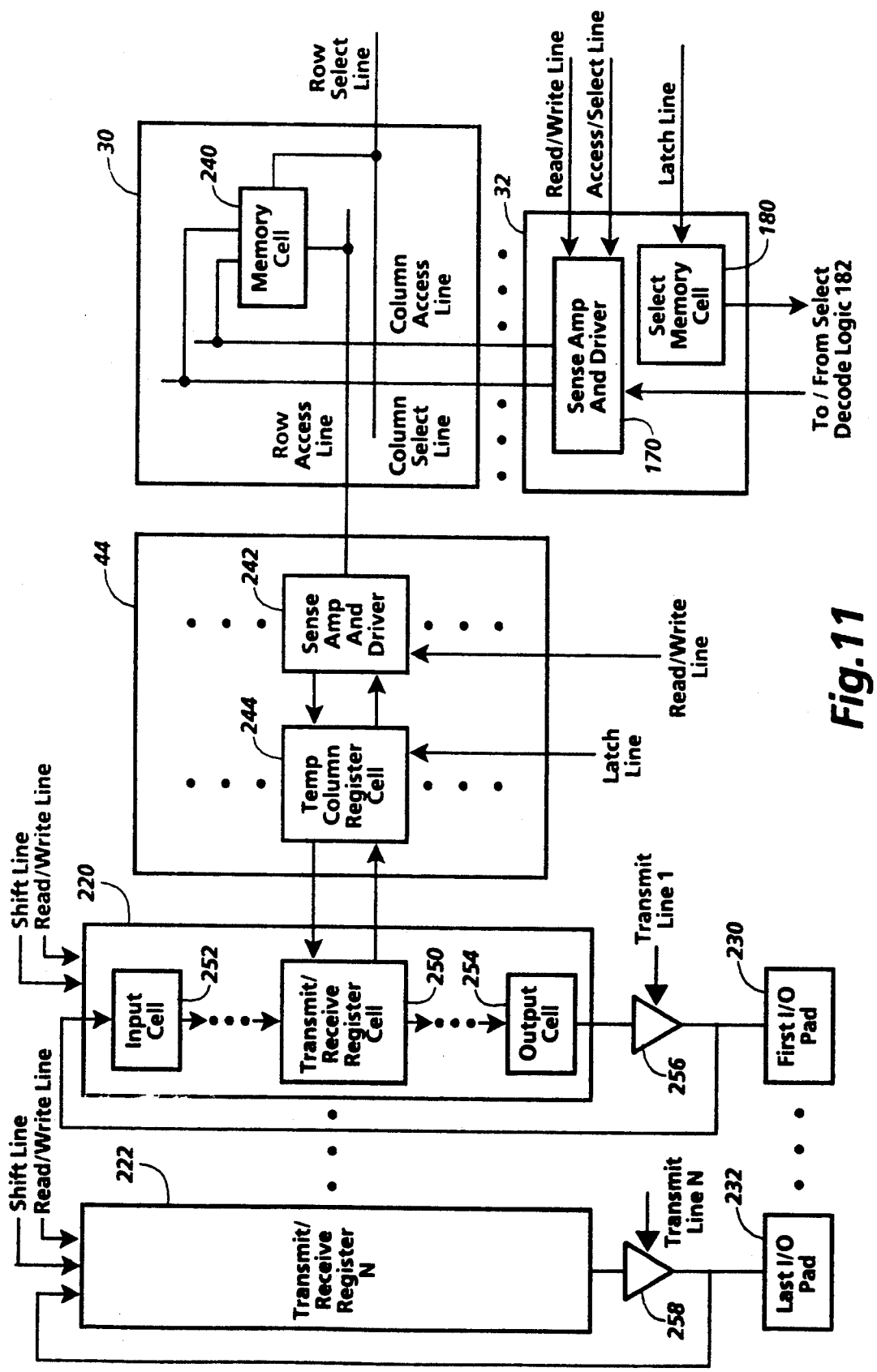
FIG. 11 is a schematic block diagram showing a column register and related components for transferring data.
Figure 12:
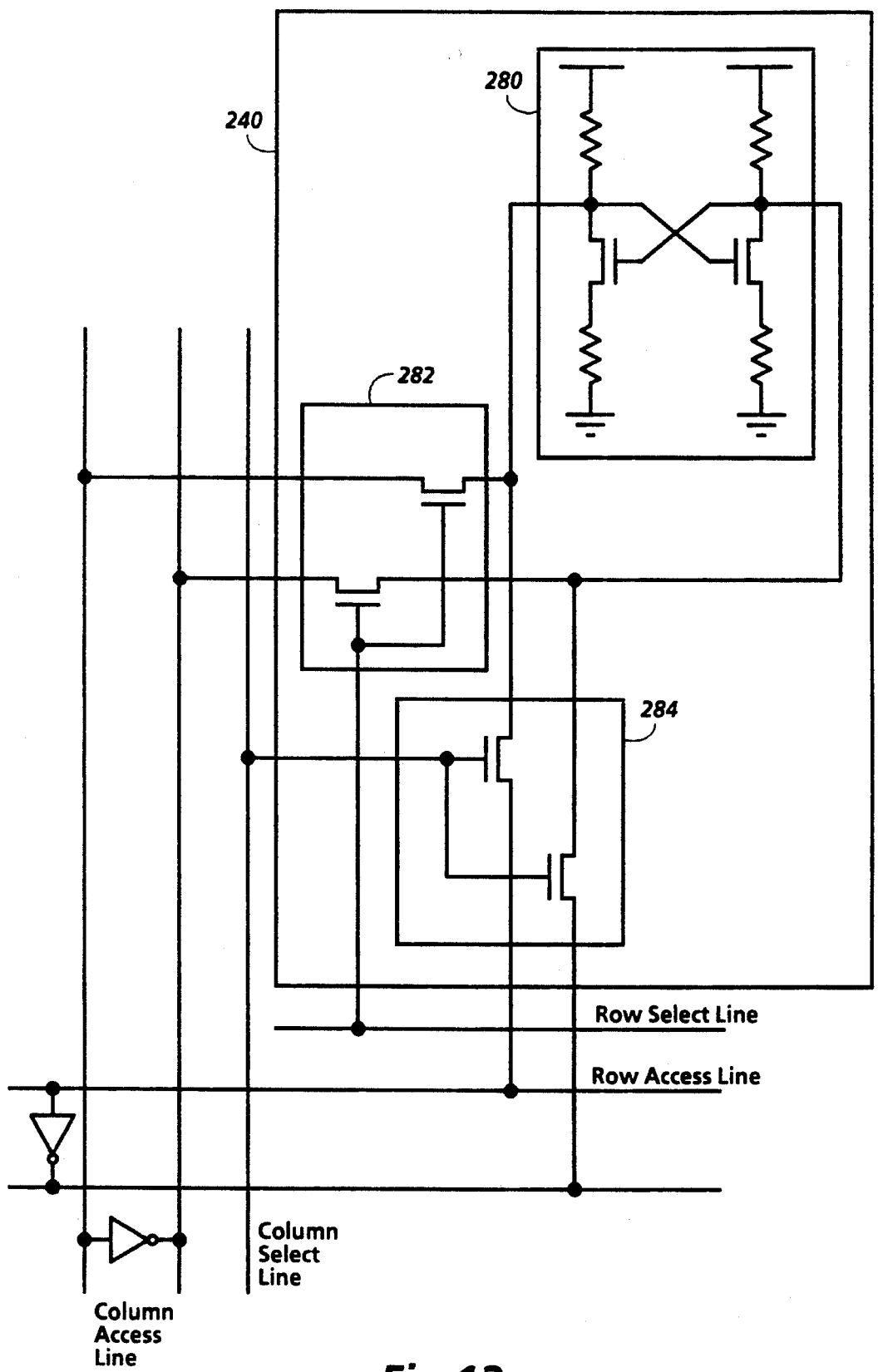
FIG. 12 is a schematic circuit diagram showing a memory element in the memory array of FIG. 11.
Figure 13:
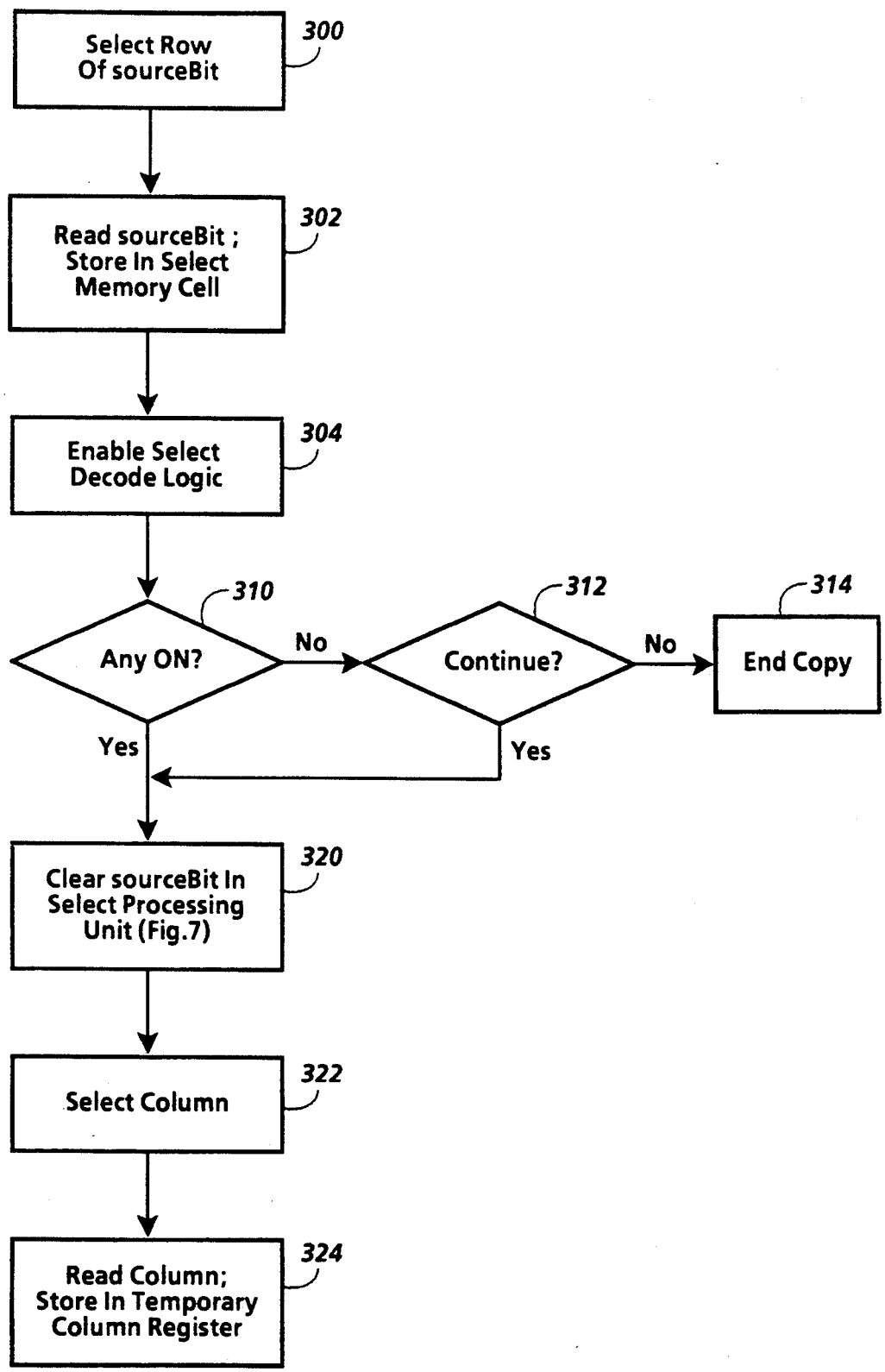
FIG. 13 is a flow chart showing steps in a read column operation using the components of FIG. 11.
Figure 14:
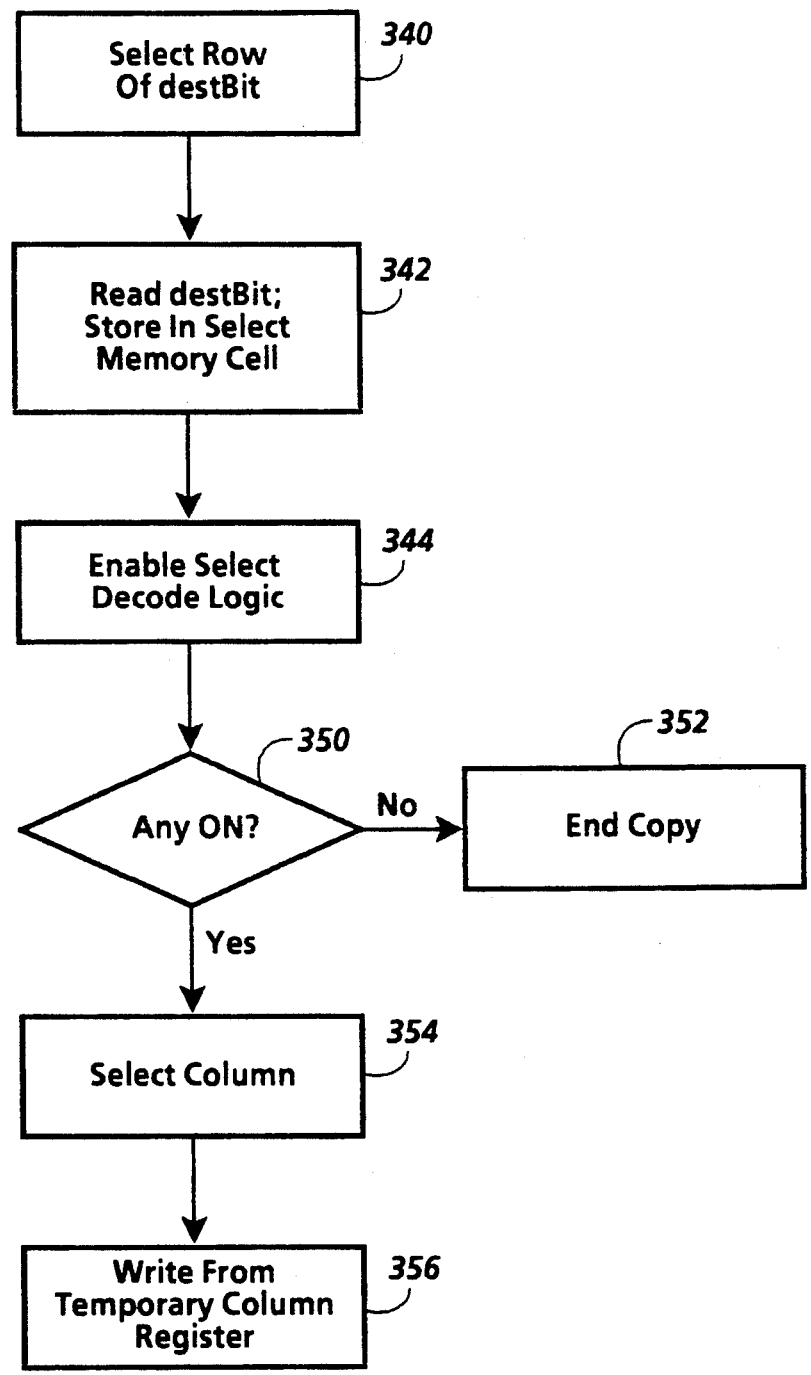
FIG. 14 is a flow chart showing steps in a write column operation using the components of FIG. 11.
Figure 15:
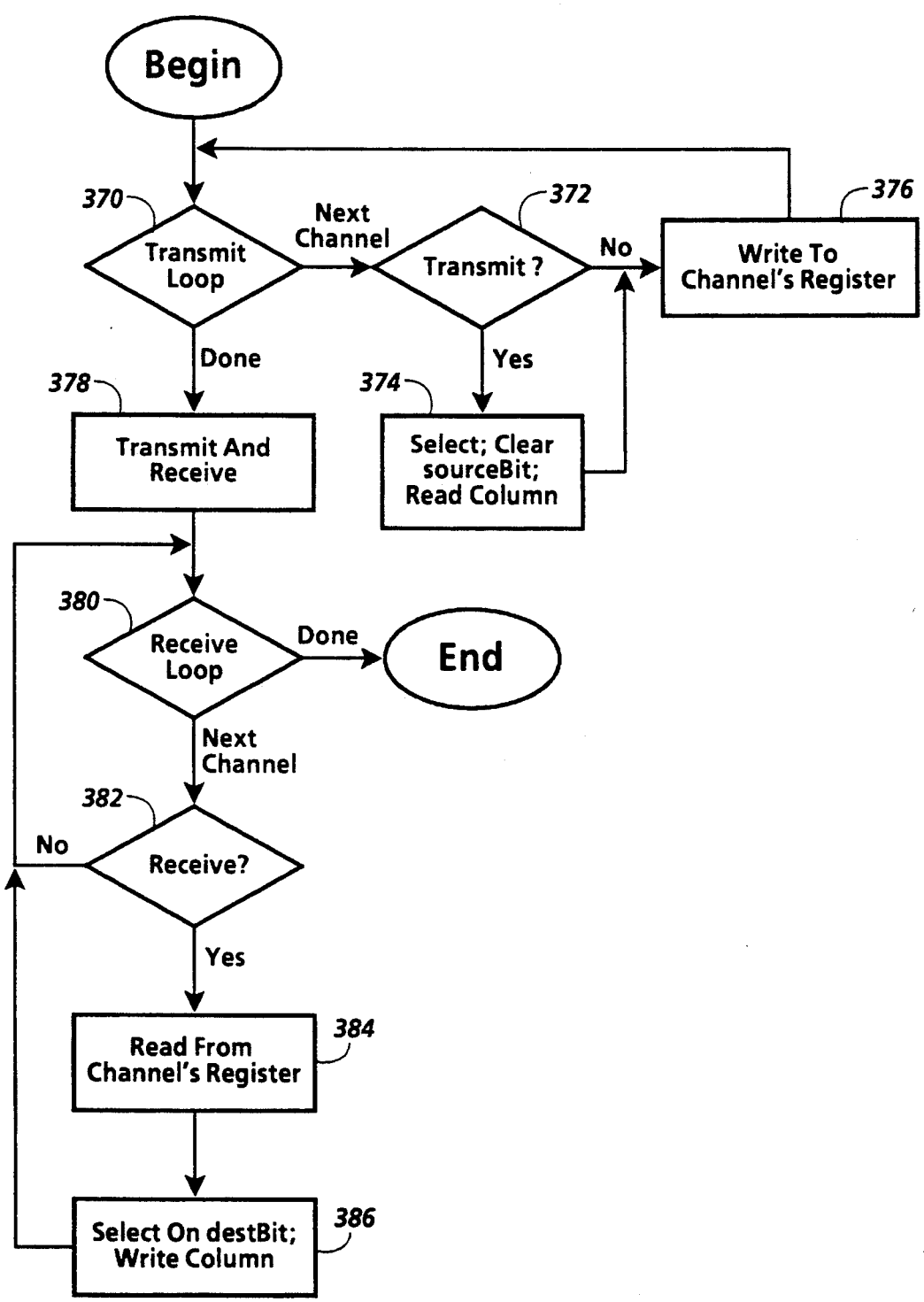
FIG. 15 is a flow chart showing steps in an external transfer operation using the components of FIG. 11.

FIG. 11 shows circuitry used in a copy operation through a column register. FIG. 12 shows a memory cell circuit for the memory array in FIG. 11. FIG. 13 shows steps in reading a column of data from the memory array to the temporary column register. FIG. 14 shows steps in writing a column of data from the temporary column register to the memory array. FIG. 15 shows steps in an intersubstrate transfer using the circuitry of FIG. 11.

The components in FIG. 11 include components described above in relation to FIGS. 3A, 8, and 9, with equivalent components having the same reference numerals. Rather than a single column shift register as shown in FIG. 3A, FIG. 11 shows plural shift registers, including column transmit/receive registers 220 and 222, connected to respective I/O pads 230 and 232. Rather than a single register for transmitting and receiving, separate transmit registers and receive registers could be provided.

Memory array 30 is accessible in two dimensions, with memory cell 240 having, in addition to the lines shown in FIG. 8, a column select line connected to its column's respective sense amp and driver 170 and a row access line connected to its row's respective sense amp and driver 242. The respective column's processing circuitry 32 includes, as in FIG. 9, select memory cell 180, and sense amp and driver 170 has an access/select line indicating whether it should access on the column access line or provide data on the column select line.

Temporary column register 44 includes, for each row of memory array 30, respective sense amp and driver 242 and respective temporary column register cell 244. Temporary column register cell 244 is connected for reading and writing data in a respective column transmit/receive register cell 250 and similarly to a respective cell in each of the other transmit receive registers, so that data can be transferred between any of the transmit/receive registers 220 through 222 and temporary column register 44. Within each transmit/receive register, two cells are connected to the respective I/O pad, as illustrated by input cell 252 and output cell 254 in transmit/receive register 220, both connected to first I/O pad 230. An appropriate device such as tristate devices 256 and 258 can be used to control the flow of data in and out of each register.

Memory cell 240 could be implemented in a wide variety of ways, including either static RAM or dynamic RAM circuitry. FIG. 12 shows an example of static RAM circuitry implementing memory cell 240. Flip-flop 280 illustratively has first and second leads, each connected to row select logic 282 and column select logic 284. When the row select line of memory cell 240 goes ON, row select logic 282 provides a conductive path between the first lead of flip-flop 280 and the column access line and also provides a conductive path between the second lead of flip-flop 280 and the line that is the inverse of the column access line. When the column select line goes ON, column select logic 284 provides a conductive path between the first lead of flip-flop 280 and the row access line and also provides a conductive path between the second lead of flip-flop 280 and the line that is the inverse of the row access line.

If memory cell 240 were implemented in dynamic RAM circuitry, as a single transistor cell, it might be possible to achieve greater density than with static RAM circuitry. It might also be possible to use fewer lines for selecting and accessing each memory cell. Conventional control circuitry could perform memory refresh operations.

FIG. 13 shows steps in loading a column from memory array 30 into temporary column register 44 during a copy operation. The steps in FIG. 13 depend on previous steps that set a bit called "sourceBit" in the memory of each processing unit that is to be copied by the copy operation. The sourceBit is cleared in all other processing units.

The step in box 300 begins by providing an address to row select logic 36 so that it selects the row of memory elements in which sourceBit is stored. The step in box 302 then provides signals to sense amp and driver 170 on its access/select and read/write lines so that it accesses sourceBit by reading the selected memory element in its column of memory elements. A signal on the latch line to select memory cell 180 causes it to store sourceBit. Then the step in box 304 provides an enable signal to select decode logic 182 to cause it to provide its decoded outputs.

The step in box 310 tests the OR line to determine whether any processing unit's sourceBit is ON. As described in the intersubstrate transfer application, a central controller performing this step may control a number of substrates, so that the central controller determines, in the step in box 312, whether the copy operation should continue even though this substrate has no more processing units to be copied. If not, the copy operation ends in box 314.

If the central controller determines that the copy operation should continue, the step in box 320 clears the sourceBit of the selected processing unit. This step can include a sequence of steps like those in FIG. 7. Each processing unit's respective bit from select decode logic 182 can be stored in its temporary memory element 74. Then, the sourceBit is read and operation logic 72 provides an OFF bit only if the sourceBit is OFF or if the bit in temporary memory element 74 is ON, otherwise providing an ON bit. The output from operation logic 72 is written to the row in which sourceBit was stored to complete the step in box 320.

The step in box 322 provides a signal on the access/select line of sense amp and driver 170 so that each processing unit's respective bit from select decode logic 182 is applied to the respective column select line, so that one column is selected. The step in box 324 provides a signal on the read/write line of each row's respective sense amp and driver 242 to cause it to read the row's memory cell in the selected column. Each row's data is then stored in the respective temporary column register cell 244 by applying a signal on the temporary column register's latch line.

FIG. 14 shows steps in loading a column from temporary column register 44 into memory array 30 during a copy operation. The steps in FIG. 14 depend on previous steps that set a bit called "destBit" in the memory of each processing unit into which data can be copied by the copy operation. The destBit it cleared in all other processing units.

The step in box 340 begins by providing an address to row select logic 36 so that it selects the row of memory elements in which destBit is stored. The step in box 342 then provides signals to sense amp and driver 170 on its access/select and read/write lines so that it accesses destBit by reading the selected memory element in its column of memory elements. A signal on the latch line to select memory cell 180 causes it to store destBit.

Then the step in box 344 provides an enable signal to select decode logic 182 to cause it to provide its decoded outputs.

The step in box 350 tests the OR line to determine whether any processing unit's destBit is ON. If not, the copy operation ends in box 352.

If there is a processing unit with its destBit ON, the step in box 354 provides a signal on the access/select line of sense amp and driver 170 so that each processing unit's respective bit from select decode logic 182 is applied to the respective column select line, so that one column is selected. The step in box 356 provides a signal on the read/write line of each row's respective sense amp and driver 242 to cause it to write the data in the respective temporary column register cell 244 into the row's memory cell in the selected column.

As can be seen by comparing FIGS. 13 and 14, the operations shown could each be implemented with two commands, the first of which would take the same form for both operations as the steps in boxes 190, 192, and 194 in FIG. 10. This command could take the form:

SelectOpCode(a3), where a3 specifies the row in which the bit indicating eligibility for selection is stored.

The closing steps in FIGS. 10, 13, and 14 differ, and each may be implemented with a respective command. The command for storing the result of selection as in boxes 202 and 204 in FIG. 10 could take the form:

StoreSelectOpCode(a4), where a4 specifies the row in which the result of selection is stored.

The step in box 320 in FIG. 13 could be implemented with StoreSelectOpCode(a4) and CalculateOpCode(s, f1, a4, s), where s specifies the row in which sourceBit is stored and f1 is the boolean function that yields ON only if the value from s is ON and the value from a4 is OFF.

Assuming that the output from select decode logic 182 can be latched until the step in box 320 completes, the command for reading a column as in boxes 322 and 324 in FIG. 13 could simply take the form:

ReadColumnOpCode.

Similarly, the command for writing a column as in boxes 354 and 356 in FIG. 14 could simply take the form:

WriteColumnOpCode.

FIG. 15 shows how the transmit/receive registers in FIG. 11 can be used to perform an intersubstrate transfer operation. The steps in FIG. 15 depend on signals indicating, for each I/O pad's respective serial channel, whether that channel will be used to transmit, receive, or neither, as discussed in more detail in the intersubstrate transfer application. Those signals should be obtained in a manner that ensures that a channel will only be used to transmit from a substrate that has sufficient valid processing units to copy and to receive at a substrate that has sufficient invalid processing units to receive copies, making the tests in box 310 of FIG. 13 and box 350 of FIG. 14 unnecessary.

The step in box 370 begins an iterative loop that is performed once for each I/O pad's respective channel. If the next channel is to be used to transmit, as determined in box 372, the step in box 374 performs a sequence of steps similar to FIG. 13 to read a column into temporary column register 44. The step in box 374 can thus be performed with a select command, a store select command, a calculate command to clear the source bits, and a read column command. The step in box 376 writes the contents of temporary column register 44 into the next channel's transmit/receive register, which can be performed with a command of the form:

LoadTransmitOpCode(n), where n indicates the channel. This command can be executed with signals on the read/write line of the channel's transmit/receive register. If the channel is to be used to receive or is not to be used, the data written into the register in the step in box 376 will not be transmitted, so that the step in box 376 could be omitted. When all the channels have been handled, the transmit/receive registers are loaded.

The step in box 378 transmits data from some of the transmit/receive registers and loads received data into other transmit/receive registers. This step can be performed with a command of the form:

TransferColumnOpCode.

This command can be provided once for the entire register or once for each bit in the register. In response to this command, signals can be provided to each transmit/receive register according to whether its data is transmitted. If its data is transmitted, the respective one of tristate devices 256 through 258 is activated by a signal on the respective transmit line. If received data is being loaded into the register or if it is neither transmitting nor receiving, the respective transmit line inactivates the respective tristate device. In either case, signals on the shift line operate the shift register. During transmission these signals cause the shift register to provide its data to the respective I/O pad for transmission and also to its own input to be reloaded. During reception these signals cause the shift register to load received data from the respective I/O pad.

The step in box 380 then begins an iterative loop that is also performed once for each I/O pad's respective channel. If the step in box 382 determines that the next channel was used to receive, the step in box 384 reads the channel's transmit/receive register into temporary column register 44, which can be performed with a command of the form:

UnloadReceiveOpCode(n).

This command can be executed with signals on the read/write line of the channel's transmit/receive register. Then, the step in box 386 performs a sequence of steps similar to FIG. 14 to write data in temporary column register 44 into a processing unit. This can be done with a select command and a write column command. When all the channels have been handled, the operation is completed.

b. Permutation Network

Figure 16:
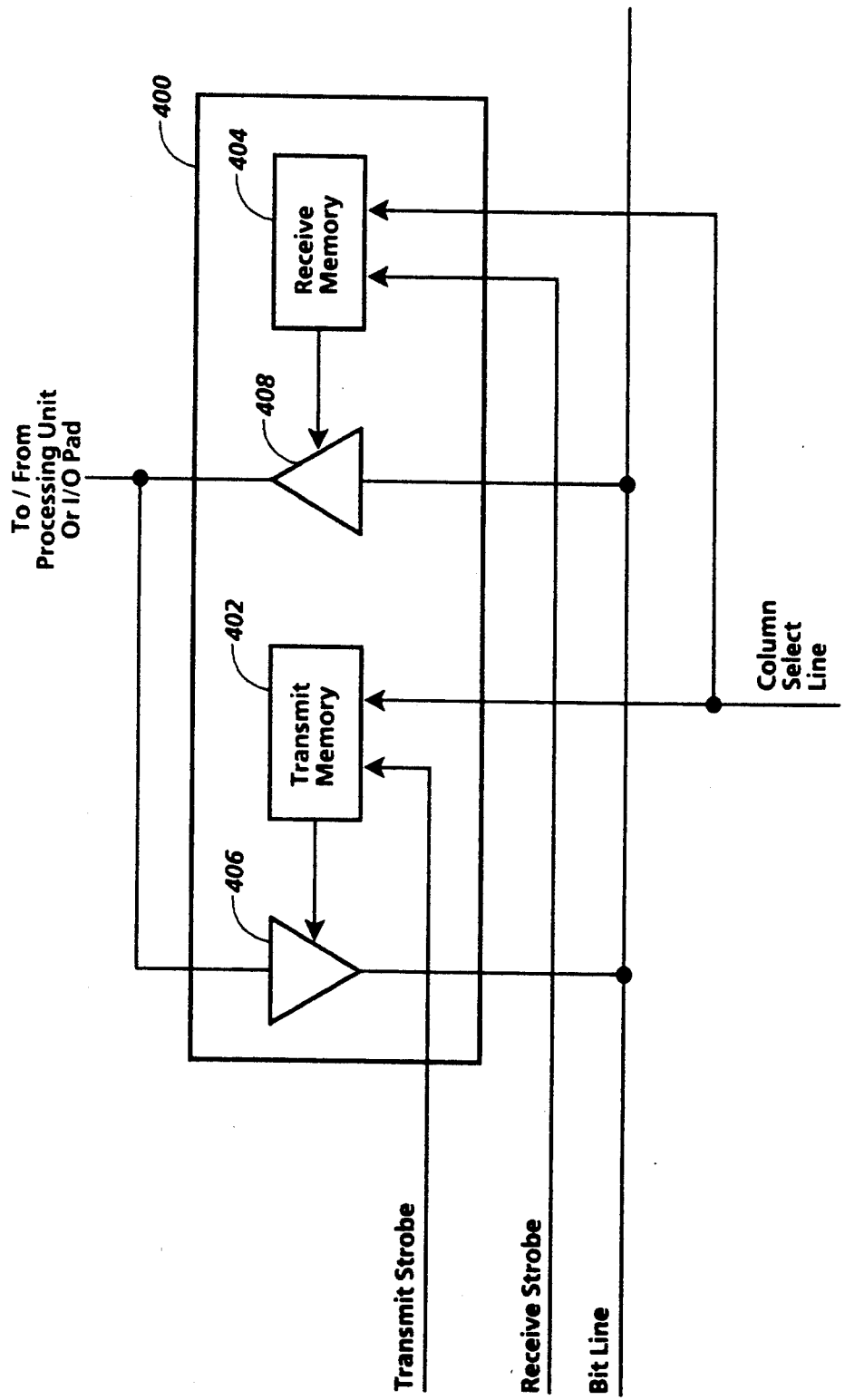
FIG. 16 is a schematic circuit diagram showing a switching element in the permutation network of FIG. 3B.
Figure 17:
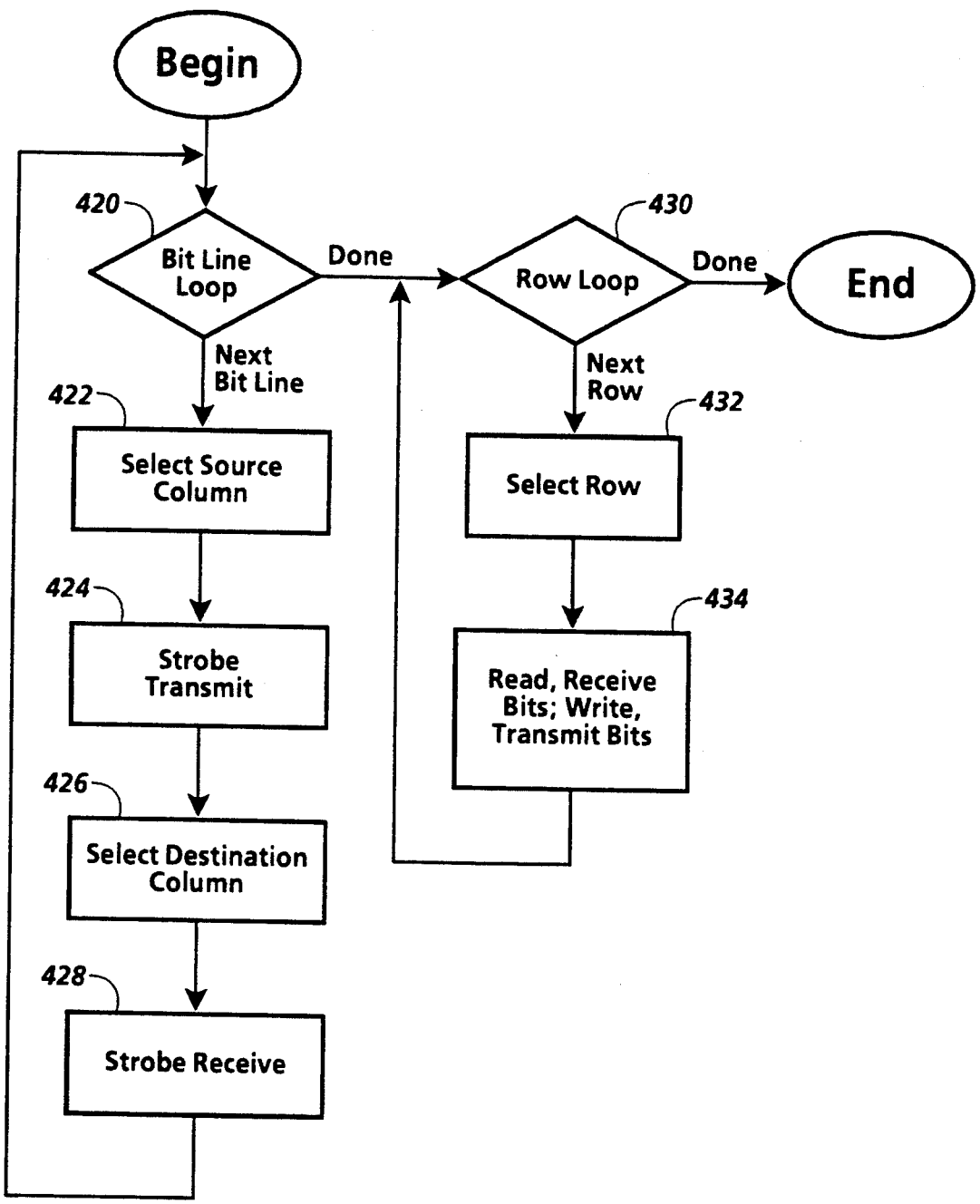
FIG. 17 is a flow chart showing steps in using switching elements as in FIG. 16 in performing a transfer operation.

FIG. 16 shows circuitry used in a copy operation through a permutation network. FIG. 17 shows steps in operating the circuitry of FIG. 16 to perform a copy operation.

Permutation network 50 in FIG. 3B could be implemented in many ways. For example, the processing units could be completely interconnected, such as by a Banyon net, so that all transfers necessary for a copy operation for a single bit could be performed in a single cycle. FIGS. 3B and 16 illustrate a simpler interconnection technique that uses a limited number of interconnections.

As shown in FIG. 3B, permutation network 50 includes a number of connecting lines, one of which is the bit line in FIG. 16. Along each of the connecting lines is a respective switching element for each of the processing units and each of the I/O pads, such as switching elements 54, 56, and 58 in FIG. 3B. FIG. 16 shows switching element 400, which could be used to implement the switching elements in permutation network 50.

Switching element 400 includes transmit memory element 402 and receive memory element 404, each of which could be based on a flip-flop as described above in relation to FIG. 12. Each memory element is connected to a column select line, which is ON when the respective processing unit or I/O pad is selected for transfer of data. Processing unit selection can be by select decode logic 182, and I/O pad selection can be directly by the control circuitry. Transmit strobe is connected to transmit memory element 402 such that a pulse on transmit strobe causes transmit memory element 402 to store the value on its respective column select line. Receive strobe is similarly connected to receive memory element 404.

When transmit memory element 402 is storing an ON value, it controls tristate device 406 so that data can be transmitted from the respective processing unit or I/O pad to the bit line. When receive memory element 404 is storing an ON value, it controls tristate device 408 so that data can be received from the bit line by the respective processing unit or I/O pad.

FIG. 17 shows steps in a copy operation using the switching element of FIG. 16. The steps of FIG. 17 include two iterative loops, the first to set up the switching elements of permutation network 50, and the second to transfer data from sources to destinations.

The step in box 420 begins the first iterative loop, which is performed for each bit line in permutation network 50. The step in box 422 selects a source column for the bit line, either by selecting on sourceBit with a command of the form SelectOpCode(s) or by selecting on an identifier of one of the I/O pads, which can be requested with a command of the form:

IOPadSelectOpCode(n), where n is an identifier of the I/O pad. The step in box 424 pulses the transmit strobe to set the source's transmit memory element 402, which can be requested with a command of the form:

StrobeTransmitOpCode(b), where b is an identifier of the bit line whose transmit strobe is to be pulsed. The step in box 426 selects a destination column for the bit line, either by selecting on destBit with a command of the form SelectOpCode(d) or by selecting on an identifier of one of the I/O pads with a command of the form IOPadSelectOp- Code(n). The step in box 428 pulses the receive strobe to set the destination's receive memory element 404, which can be requested with a command of the form:

StrobeReceiveOpCode(b).

The steps in boxes 422, 424, 426, and 428 could be ordered differently as long as they result in both a source and a destination connected to the bit line.

The step in box 430 begins the second iterative loop, which is performed for each row in memory array 30. The step in box 432 provides a row identifier to row select logic 36 in order to select the next row. The row identifiers could be obtained, for example, by starting with the identifier of the first row of memory array 30 and incrementing after each iteration of the second loop.

The step in box 434 reads the bits in the selected row for the sources that are processing units and receives bits from any sources that are I/O pads. The step in box 434 also writes the bits in the selected row for the destinations that are processing units and transmits bits to any destinations that are I/O pads. The step in box 434 thus requires, for processing units, that destBit or sourceBit be temporarily stored so that operation logic 72 can perform an appropriate operation to obtain the value to be written into the selected row, either the value that was read or the value that was received from permutation network 50. The step in box 434 includes, for I/O pads, the operation of sense amps and drivers to receive or transmit data.

The steps in boxes 432 and 434 could be requested with a command of the form:

NetworkTransferOpCode(b,r), where r specifies the row being transferred. In order to save a bit such as destBit, as is useful in a fork operation, the control circuitry can test in box 430 whether r is the row in which the saved bit is stored. If so, the command NetworkTransferOpCode(b,r) is not provided for that row.

4. Count Operation

The count operation can be used to count the valid processing units, which is useful in forking. It can also be used to count processing units whose respective combinations of values satisfy a logical condition, which can be used in ordering a value assignment search. The count operation can also play a part in balancing the numbers of valid processing units on interconnected substrates, as described in the intersubstrate transfer application, incorporated herein by reference.

Figure 18:
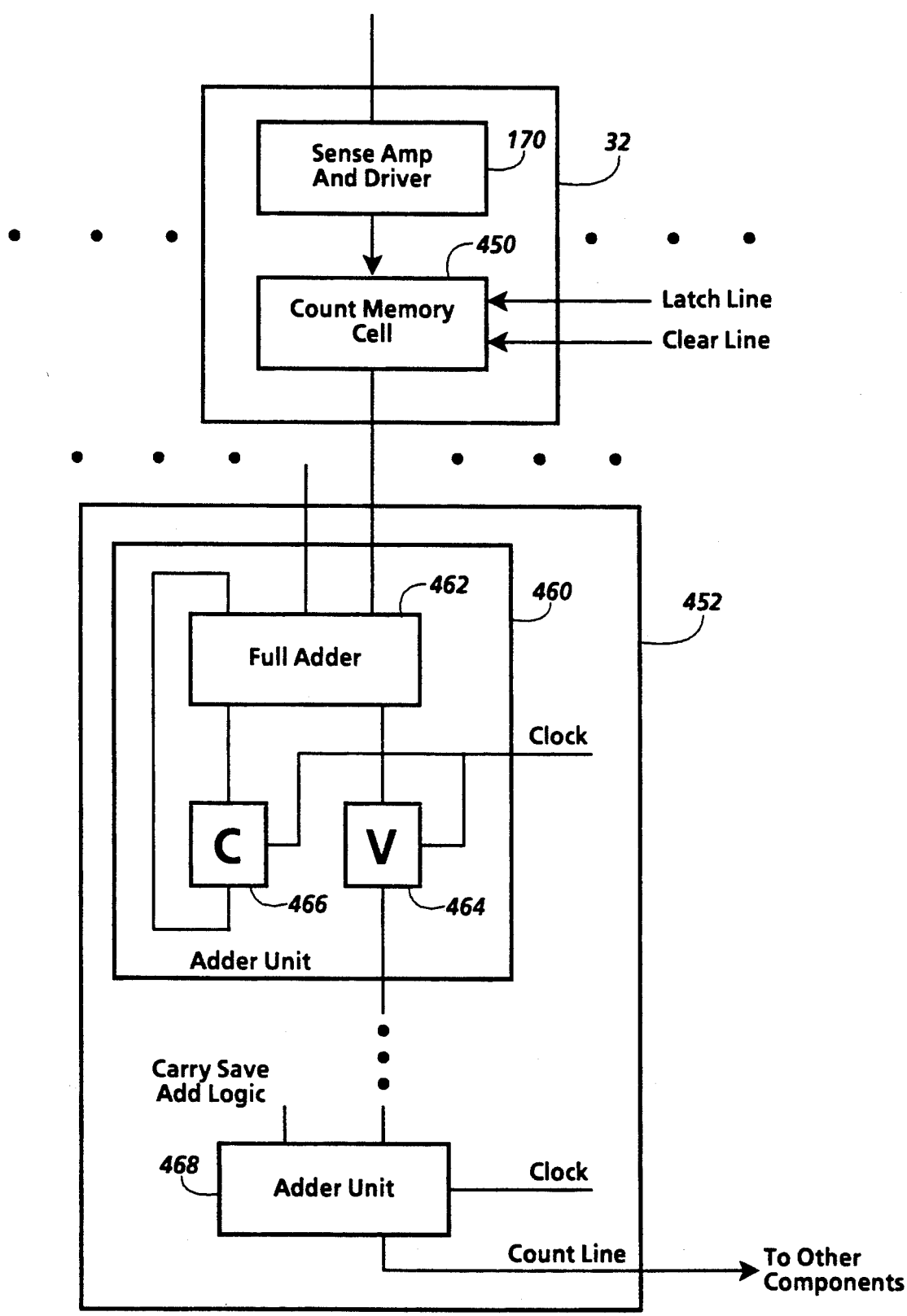
FIG. 18 is a schematic block diagram of components for performing a count operation.

FIG. 18 shows components that can perform a count operation. Processing circuitry 32 for each column of the memory array includes sense amp and driver 170 as described above in relation to FIG. 9 and count memory cell 450, which could be the same memory element as select memory cell 180 and temporary memory element 74. Carrysave add logic 452 is connected to receive data from all the count memory cells 450 and to perform an adding operation that produces count data that can be serially output. As shown, carrysave add logic 452 can be implemented as a binary tree of conventional bit serial carrysave adders, with $\log_2 N$ levels, where N is the number of processing units on the substrate.

The value from count memory cell 450 and the value from the count memory cell of an adjacent processing unit are provided to adder unit 460 at the lowest level of the binary tree. Adder unit 460 includes full adder 462, value store 464, and carry store 466. Full adder 462 adds the two input values and the value from carry store 466 to obtain a low order bit that is provided as output through value store 464 and a high order bit that is stored in carry store 466. Adder unit 468, which can have the same structure as adder unit 460, is at the highest level of the tree, and its output is provided on a count line connected to other components, such as to a shift register. All of the adder units in the tree are clocked to obtain each bit of output.

The components in FIG. 18 can be operated as follows to obtain a count: First, an OFF value can be stored in the count memory cell of each of the processing units to ensure that all of the inputs to the adder units at the lowest level of the tree are OFF. Then the adder units, including adder units 460 and 468, can be clocked for N cycles to clear all of the carry stores. Then, a row identifier can be provided to row select logic 36 so that it selects the row in which each processing unit is storing a bit indicating whether it should be counted. A signal on its read/write line can cause sense amp and driver 170 to read the selected row, and a signal on its latch line can cause count memory cell 450 to store the data read from the selected row, so that the values from the count memory cells are provided to the lowest level adder units. The adder units can then be clocked once to receive these values and start adding.

Then, an OFF value can then be stored in the count memory cell of each of the processing units, so that all subsequent input values to the lowest level adder units are OFF and will not affect the count. Then, $(\log_2 N)\text{-}1$ clock pulses can cause carrysave add logic 452 to complete addition so that the next clock pulse provides the least significant bit of the output count. The next $\log_2 N$ clock pulses provide bits of the count.

The count operation can be requested with a command of the form:

CountOpCode(a5), where a5 specifies the row in which each processing unit is storing a bit indicating whether it should be counted.

5. Control Circuitry and Central Controller

The commands set forth above can be provided by a central controller that that uses a number of interconnected substrates to perform value assignment search but that is not located on any of those substrates. The central controller in turn receives higher level commands from a host system that manages the search, making decisions about which operations should be performed and in what sequence, employing techniques such as those described in the intersubstrate transfer application and the Massively Parallel ATMS application. To perform a specific operation, the central controller can provide the commands to control circuitry on each substrate.

Figure 19:
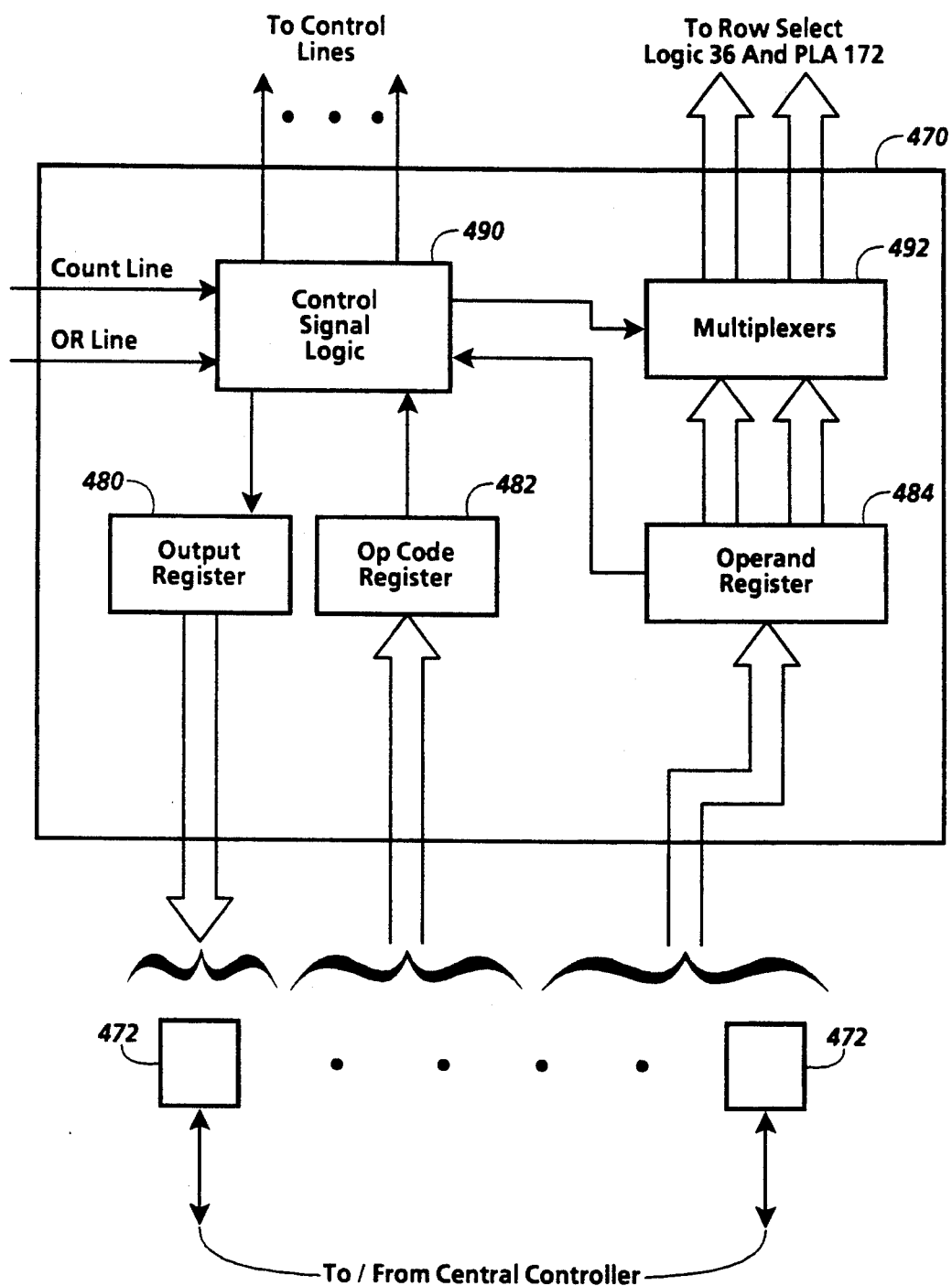
FIG. 19 is a schematic block diagram of control circuitry.

FIG. 19 shows how a substrate's control circuitry could be implemented. To reduce use of substrate area, control circuitry 470 in FIG. 19 can be structured to execute a basic set of simple commands that includes the commands set forth above, the commands described in the intersubstrate transfer application, and a few other commands as described below. These commands suffice for value assignment search. The commands are received through a set of I/O pads 472, some of which can also be used to return information to the central controller, using output register 480.

When a command is received on I/O pads 472, its opcode field is stored in opcode register 482 and its operand fields are stored in operand registers 484. Control signal logic 490 is connected to receive the opcodes and some of the operands, and uses the opcodes, the operands, the signals from the count line and the signals from the OR line, as well as other data in determining sequences of control signals to provide on the various control lines to components on the substrate. The manner in which the control signals are provided can be understood from the descriptions of the commands above. Control signal logic 490 is also connected to control multiplexers 492 to select the portion of operand register 484 from which a row specifier should be sent to row select logic 36 and the portion from which a function code should be sent to PLA 172. Control signal logic 490 is connected to provide the control signals in parallel to each processing unit's respective processing circuitry 32.

As described above, value assignment search can be analyzed in terms of five basic types of operations: initializing, forking, constraint checking, killing, and accumulating results. The central controller can use the commands as described above to perform each of these types of operations.

For example, an initialize operation can be performed in two steps. The first step selects one of the substrates as the first substrate in the manner described in the intersubstrate transfer application. The second step provides commands of the form CalculateOpCode(m, f2, x1, x2), SelectOpCode(m), and StoreSelectOpCode(v). In the calculate command, x1 and x2 are any arbitrary row identifiers, f2 is a boolean function that always produces ON as its result, and m is the row in which ON is stored after it is produced by f2. Then, the select command selects one of the processing units and the result of the select operation is stored in the valid bit v of each processing unit, so that the selected processing unit is the only valid one. After this point, the valid bits should not be modified by any operations other than a fork operation or a kill operation, and the central controller may have automatic means for protecting against valid bit modification.

Figure 20:
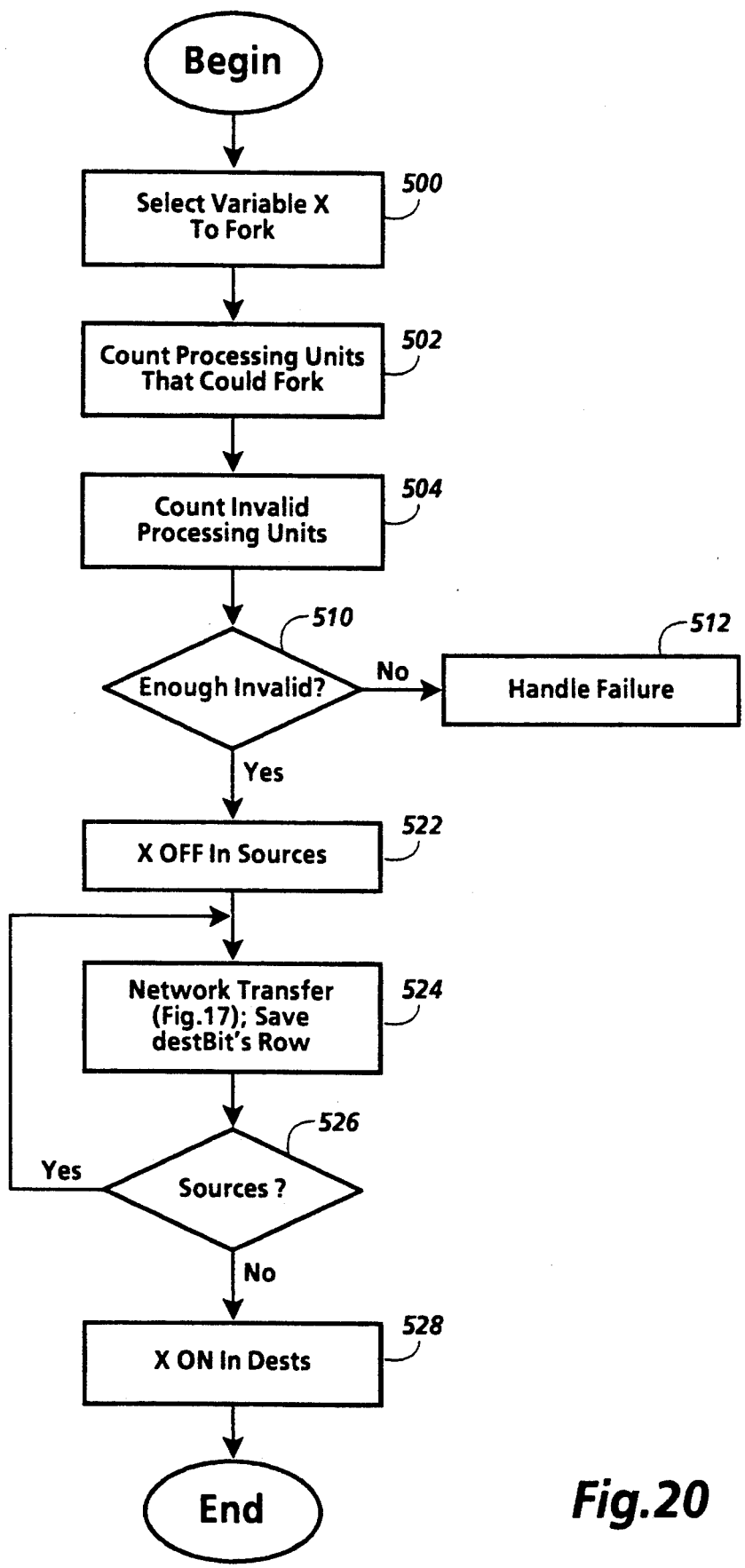
FIG. 20 is a flow chart showing steps in a fork operation using the control circuitry of FIG. 19 with circuitry like that shown in FIG. 3A.
Figure 21:
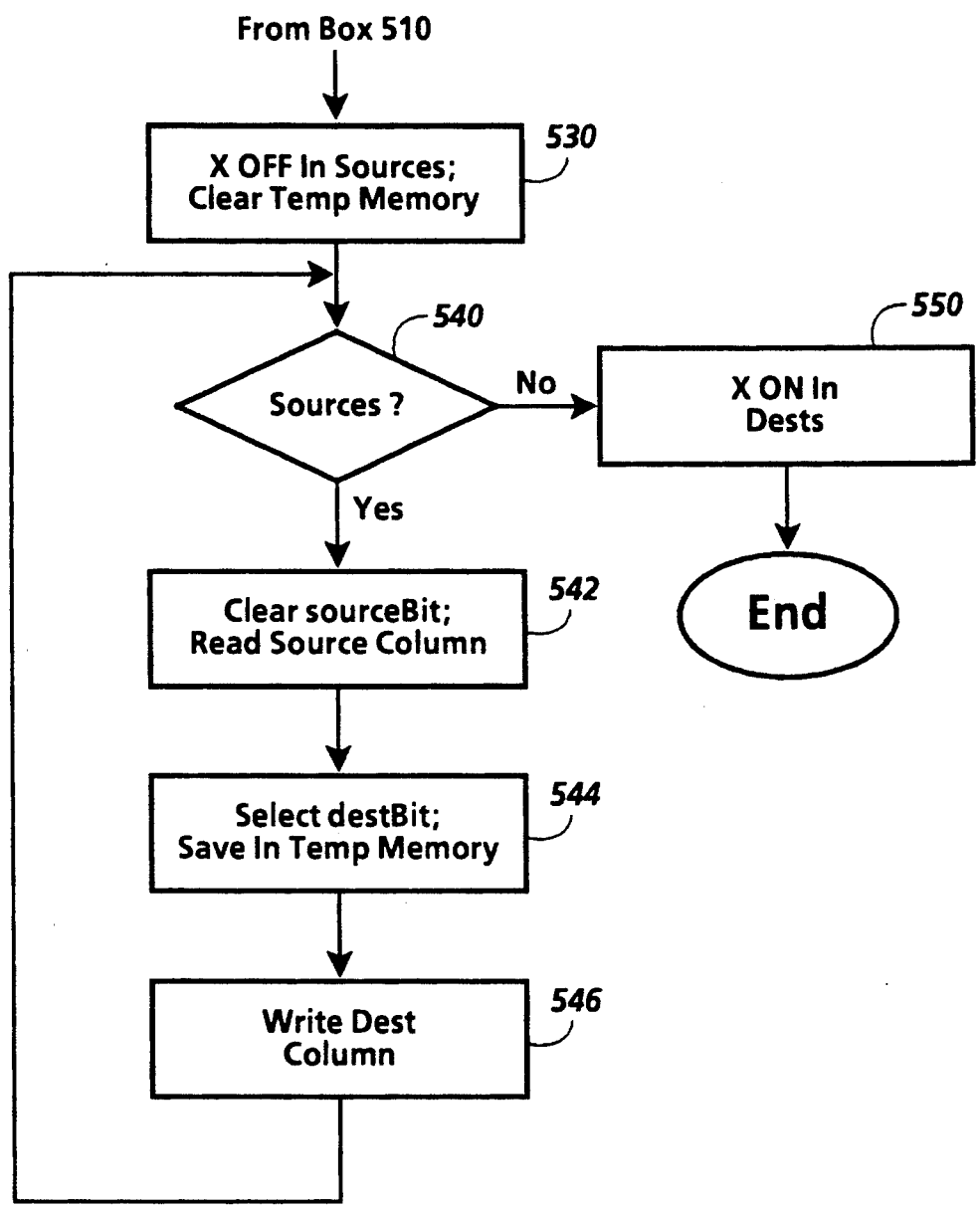
FIG. 21 is a flow chart showing steps in a fork operation using the control circuitry of FIG. 19 with circuitry like that shown in FIG. 3B.

FIG. 20 shows how the central controller could perform a fork operation for a binary variable using a permutation network as in FIG. 3B. FIG. 21 shows alternative steps for binary forking with a column register as in FIG. 3A. A multi-value variable could be forked by a series of binary fork operations.

The step in box 500 in FIG. 20 begins the fork operation by selecting the variable X as the variable to be forked. This step could be performed in various ways. For example, a fork operation could be attempted whenever a new variable is found in a constraint being applied. Or new variables could initially be assigned the NULL value and a fork operation could be attempted only when necessary to make further progress; at that time the variable to be forked could be chosen based on having the smallest number of processing units requiring forking for that variable, using an intersubstrate count operation as described in the intersubstrate transfer application.

When the variable X has been chosen, the step in box 502 counts the processing units that can fork on variable X. This step can be implemented by using calculate commands to obtain, for each processing unit, a sourceBit indicating whether it can be forked for X and by using a count command to count the processing units with sourceBit ON. In addition, the central controller can provide a command of the form:

StoreCountOpCode, in response to which control signal logic 490 can store the count obtained in box 502 in an internal register for subsequent use.

The step in box 504 then counts the invalid processing units that could receive copies during forking. This step can be implemented by using a calculate command to obtain, for each processing unit, a destBit which is the inverse of the valid bit and by using a count command to count the processing units with destBit ON.

The step in box 510 compares the counts from boxes 502 and 504 to determine whether the number of invalid processing units is large enough so that there is at least one for each of the processing units that could fork. This step can be implemented with a command of the form:

CompareCountsOpCode, in response to which control signal logic 490 compares the stored count from box 502 with the count from box 504 and provides a signal on one of the I/O pads 472 indicating the result. If there are not enough invalid processing units, the step in box 512 handles the failure of the fork operation, such as by attempting to fork a different variable. If it is necessary to fork but none of the variables can be forked due to insufficient invalid processing units, steps can be taken to reduce the size of the search space as described in the intersubstrate transfer application.

The step in box 522 prepares for a permutation network transfer by using calculate commands to assign X the value OFF in all processing units with sourceBit ON. The transfer can then be made in box 524 by following the steps in FIG. 17, selecting each source column based on sourceBit and each destination column based on destBit. In addition, sourceBit should be cleared in each source column selected in box 422 and the row in which destBit is stored should not be selected and copied in the steps in boxes 432 and 434. After the transfer, the test in box 526 uses a select command and the intersubstrate OR operation described in the intersubstrate transfer application to determine whether any processing units remain with sourceBit on. If so, the transfer in box 524 is repeated until all copying is completed. Then, the step in box 528 uses calculate commands to assign X the value ON in all processing units with destBit ON, completing the fork operation.

The steps in FIG. 21 begin after the step in box 510 in FIG. 20. Therefore, if the substrates in a processor had both a column register and a permutation network, a branch could be taken after box 510 depending on which transfer technique was appropriate. This branch can be based on the relative speed of the two types of transfer. The column register may be faster if there are very few forking processing units. The permutation network may be faster if a large number are forking.

The step in box 530 begins by using calculate commands to assign X the value OFF in all processing units with sourceBit ON and to clear a temporary memory element for all processing units, to be used to store a bit indicating the destination processing units. Then the test in box 540 uses a select command and the intersubstrate OR operation described in the intersubstrate transfer application to determine whether any processing units remain with sourceBit on. If so, the step in box 542 uses calculate commands to clear the sourceBit of the processing unit selected by the select command. The step in box 540 also uses the read column command to read the selected processing unit's data. The step in box 544 uses a select command on destBit to select a destination processing unit and uses a calculate command to save the bit indicating selection in the destination processing unit's temporary memory element. The step in box 546 then uses a write column command to write the destination processing unit. When no more processing units have sourceBit ON, the step in box 550 uses calculate commands to assign X the value ON in all processing units with temporary memory elements ON, completing the fork operation.

A constraint checking operation can be performed with one or more calculate commands. The calculate commands indicate a sequence of logical or arithmetic operations that produce a bit indicating the result of applying the constraint. If a processing unit's combination of values is consistent with the constraint, the result bit can be ON, but if inconsistent the result bit can be OFF. Any constraint expression can be evaluated with a sequence of calculate operations, provided that the operations in the expression are functions accepted by the operation logic of each processing unit.

A kill operation can be performed by a calculate operation that clears the valid bit of each processing unit that has a result bit that is OFF.

A results accumulation operation can be performed iteratively by a querying process. First, a sequence of calculate commands produces a result bit that indicates, for each valid processing unit, whether its respective combination of values meets a logical condition. Then, an intersubstrate count command as described in the intersubstrate transfer application obtains a count of the processing units meeting the condition. These two steps can be repeated to determine whether any valid processing units have a respective combination of values meeting any arbitrarily narrow condition.

A results accumulation operation could alternatively be performed by reading out the data of the remaining valid processing units, in the manner described in the intersubstrate application.

6. Layouts

Figure 22:
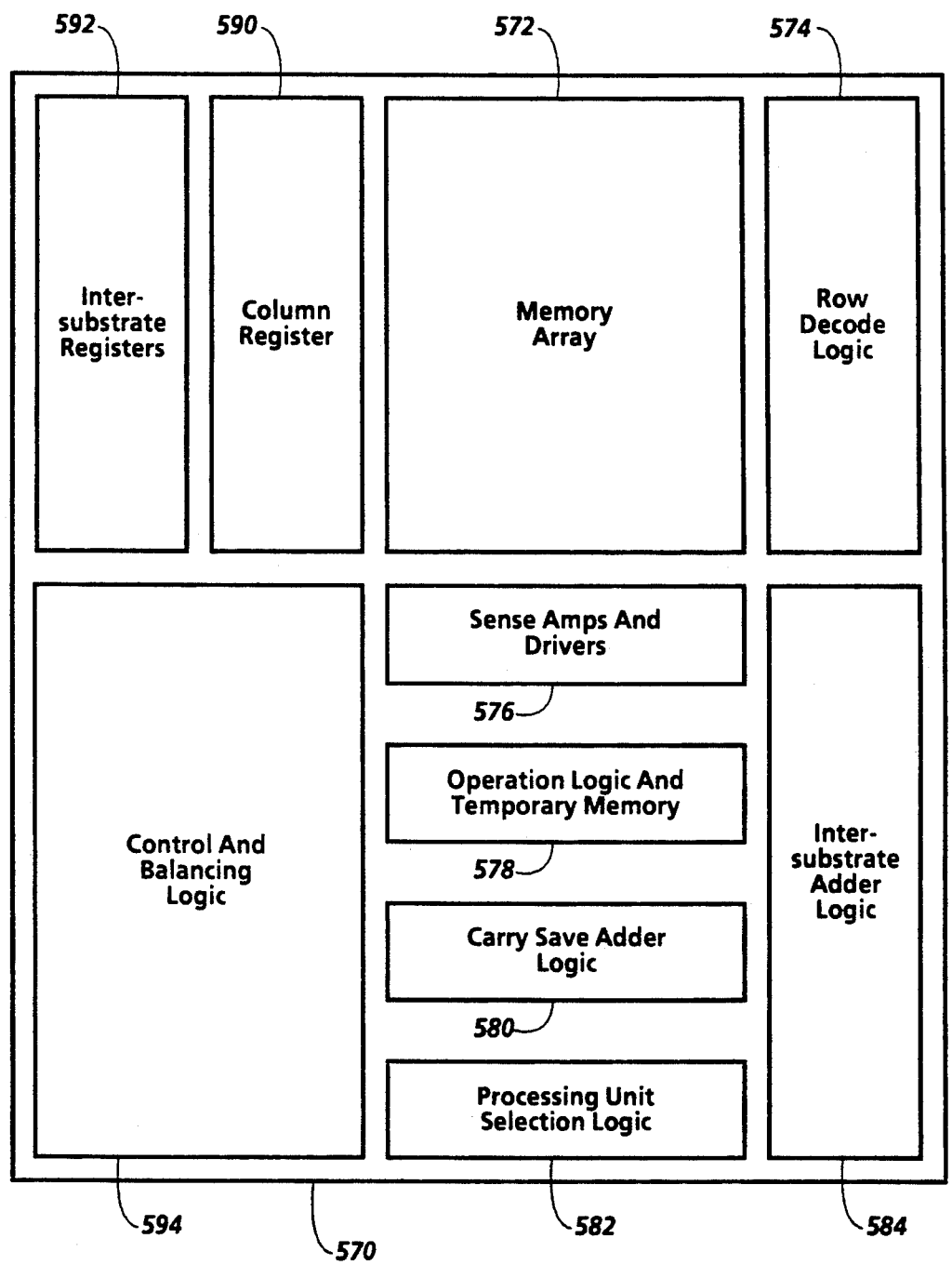
FIG. 22 is a schematic layout diagram showing an arrangement of circuitry on a substrate that includes the components shown in FIG. 3A.
Figure 23:
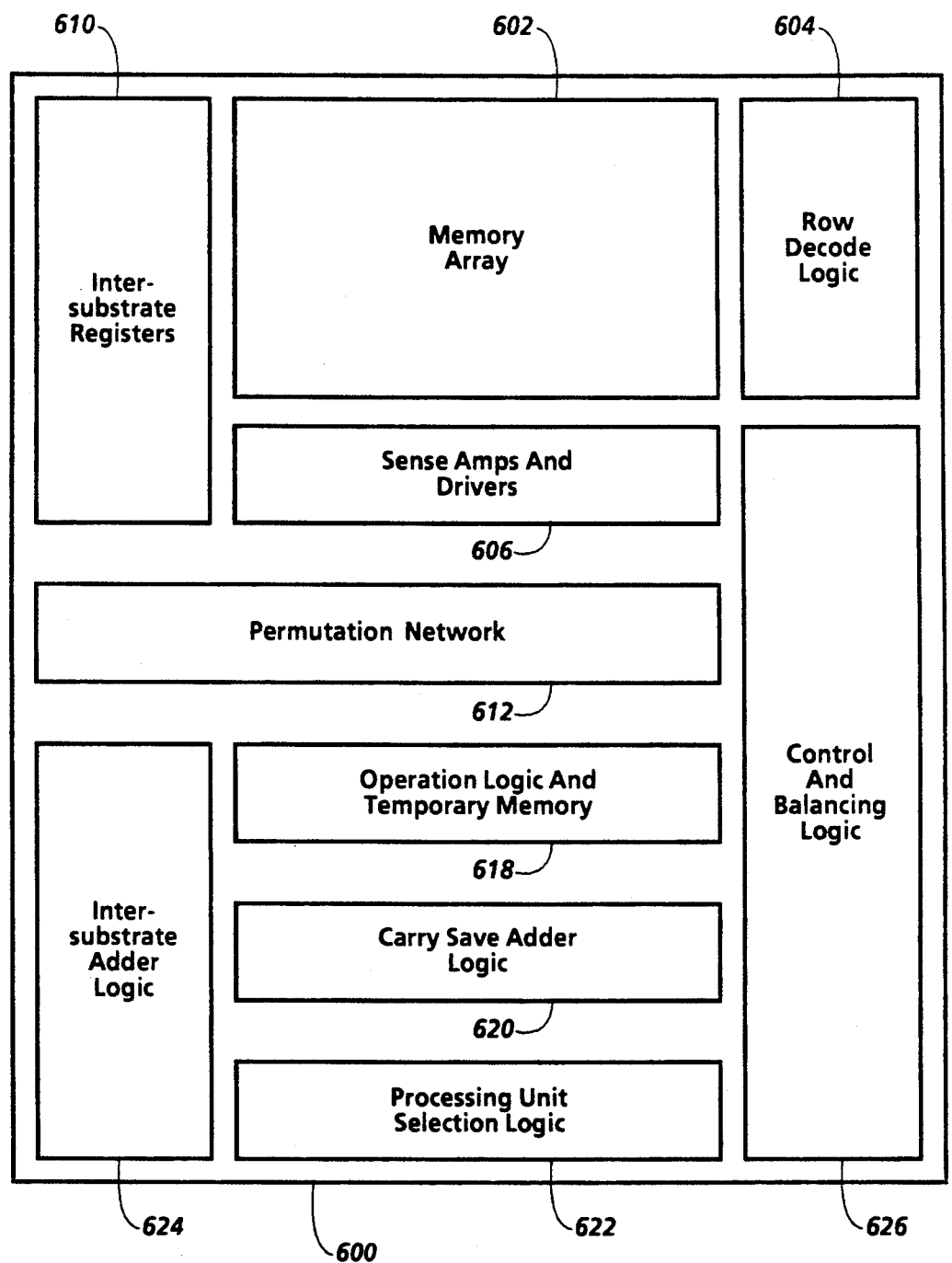
FIG. 23 is schematic layout diagram showing an arrangement of circuitry on a substrate that includes the components shown in FIG. 3B.

FIG. 22 shows an example of how components according to the invention, including a column register, could be laid out on a substrate. FIG. 23 shows another example, with a permutation network. In each case, only major components are shown, and interconnections, I/O pads, and other small scale features are omitted.

Substrate 570 in FIG. 22 has a rectangular memory array 572, with row decode logic 574 along a first side and sense amps and drivers 576 for each column along a second side perpendicular to the first, so that row select lines enter memory array 572 through the first side and column select lines and column access lines enter through the second side. Operation logic and temporary memory 578 for the columns extends parallel to sense amps and drivers 576 for ease of interconnection, and carrysave adder logic 580 and processing unit selection logic 582 extend in the same manner for connection to each processing unit. Intersubstrate adder logic 584 is positioned next to carrysave adder logic 580.

Column register 580 is along a third side of memory array 572, opposite the first side, so that row access lines enter through the third side. Intersubstrate registers 592 extend parallel to column register 580 for ease of interconnection. The bulk of control and balancing logic 594 is positioned in a remaining area, and is extensively interconnected to all the other components shown.

Substrate 600 in FIG. 23 similarly has rectangular memory array 602, row decode logic 604, and sense amps and drivers 606. Intersubstrate transfer registers 610 are positioned for connection to permutation network 612, which is in turn positioned for interconnection to sense amps and drivers 606. Operation logic and temporary memory 618, arrysave adder logic 620 and processing unit selection logic 622 extend as in FIG. 22. Intersubstrate adder logic 624 is positioned next to carrysave adder logic 620. The bulk of control and balancing logic 626 is positioned in a remaining area, and is extensively interconnected to all the other components shown.

E. Variations

The invention has been described in terms of a valid bit that is stored in each processing unit's memory; all processing units, including invalid processing units, perform all operations, with the results in invalid processing units being ignored. The valid bit might alternatively be a special bit of memory in each processing unit's processing circuitry, and could be directly connected as an operand to the operation logic. With this approach, invalid processing units might not perform the operations performed by valid processing units.

The invention has been described in terms of operation logic that obtains boolean functions of two arguments, but the invention might alternatively be implemented with logic that can obtain arithmetic functions.

For efficiency, it may be desirable to include extra logic in each processing unit. This might make it possible to reduce the number of instructions to execute common commands. As noted above, the valid bit could be a dedicated memory cell in the processing circuitry, like the temporary memory element. Special logic in each unit's processing circuitry could combine the functioning of two or more PLA's or other operation logic. This might allow the combined circuitry to utilize two or more times as many bit positions for problems that require it. This feature might reduce the total processor count by a factor of two or more.

F. Miscellaneous

The following copending, coassigned U.S. patent applications are incorporated herein by reference: U.S. Ser. No. 07/205,125, entitled "Massively Parallel Assumption-Based Truth Maintenance," filed Jun. 10, 1988 and referred to herein as the Massively Parallel ATMS application, now issued as U.S. Pat. No. 5,088,048; U.S. Ser. No. 07/260,205, entitled "Disjunctive Unification," filed Oct. 19, 1988; and U.S. Ser. No. 07/629,732, entitled "Transferring a Processing Unit's Data Between Substrates in a Parallel Processor" and referred to herein as the intersubstrate transfer application. A processor according to this invention could be included in a system in the manner described in the intersubstrate transfer application.

The invention has been described in relation to a high density VLSI RAM implementation that could be applied to any suitable substrate with any suitable processing technology to create circuitry with any suitable form of digital logic. The invention might also be implemented at other scales of integration.

The invention could be useful in such diverse areas as the formatting of text, the parsing of text, or job scheduling or other techniques that find optimal paths.

Although the invention has been described in relation to various implementations, together with modifications, variations and extensions thereof, other implementations, modifications, variations and extensions are within the scope of the invention. The invention is therefore not limited by the description contained herein or by the drawings, but only by the claims.

What is claimed:

1. A method of operating a processor to perform a value assignment search for two or more variables, each variable having a respective set of possible values, the value assignment search seeking combinations of values of the variables that are consistent with a set of constraints, each combination of values including at most one of the respective possible values of each of the variables; the processor including:

a substrate; and an integrated circuit on the substrate; the integrated circuit including:

an array of memory elements that includes two or more row sets of memory elements and two or more column sets of memory elements, each memory element being in a respective one of the row sets and a respective one of the column sets;

row select circuitry for selecting any of the row sets; each memory element in a row set being selected when the row set is selected; and for each column set, respective processing circuitry connected to the memory elements in the column set; the processing circuitry further being for performing operations on data; the processing circuitry of all of the column sets being operable in parallel; the memory elements in each column set and the respective processing circuitry forming a respective processing unit;

the method comprising steps of:

storing first data in the memory elements in a first one of the column sets and storing second data in the memory elements in a second one of the column sets; the first data indicating a first combination of possible values of the variables; the second data indicating a second combination of possible values of the variables; the first and second combinations each including at most one of the respective possible values of each of the variables;

operating the row select circuitry to select a first memory element in the first column set and a second memory element in the second column set; and operating the first column set's respective processing circuitry to perform a first operation that includes accessing the first memory element and operating the second column set's respective processing circuitry to perform a second operation that includes accessing the second memory element; the first and second operations being performed in parallel; the first and second operations determining whether the first and second combinations are consistent with a constraint.

2. A method of operating a processor to perform a value assignment search for two or more variables, each variable having a respective set of possible values, the value assignment search seeking combinations of values of the variables that are consistent with a set of constraints, each combination of values including at most one of the respective possible values of each of the variables; the processor including:

a substrate; and parallel processing circuitry on the substrate; the parallel processing circuitry including:

an array of memory elements that includes two or more row sets of memory elements and two or more column sets of memory elements, each memory element being in a respective one of the row sets and a respective one of the column sets;

row select circuitry for selecting any of the row sets; each memory element in a row set being selected when the row set is selected; and for each column set, respective processing circuitry connected for accessing any of the memory elements in the column set; the processing circuitry further being for performing operations on data such that the respective processing circuitry of all of the column sets can perform operations on data in parallel;

the method comprising steps of:

storing first data in the memory elements in a first one of the column sets and storing second data in the memory elements in a second one of the column sets; the first data indicating a first combination of possible values of the variables; the second data indicating a second combination of possible values of the variables; the first and second combinations each including at most one of the respective possible values of each of the variables;

operating the row select circuitry to select a first memory element in the first column set and a second memory element in the second column set; and operating the first column set's respective processing circuitry to perform a first operation that includes accessing the first memory element and operating the second column set's respective processing circuitry to perform a second operation that includes accessing the second memory element; the first and second operations being performed in parallel; the first and second operations determining whether the first and second combinations are consistent with a constraint.

3. The method of claim 2 in which the parallel processing circuitry further includes column transfer circuitry for copying data from the memory elements in any of the column sets into the memory elements in any of the column sets; the step of storing first and second data comprising a substep of operating the column transfer circuitry to copy the first data from the memory elements in the first column set into the memory elements in the second column set.

4. The method of claim 3 in which the step of storing first and second data further comprises a substep of modifying the copied first data in the second column set to obtain the second data so that the second data in the second column set indicates a different possible value for one of the variables than the first data in the first column set.

5. The method of claim 3 in which the copied first data in the second column set is the second data; the step of storing first and second data further comprising a substep of modifying the first data in the first column set so that the second data in the second column set indicates a different possible value for one of the variables than the first data in the first column set.

6. The method of claim 3 in which the step of storing first and second data further comprises a substep of storing destination data indicating that the second column set received copied data.

7. The method of claim 3 in which the first column set further includes a respective valid memory element for indicating whether the first combination of values is consistent with the constraints; the substep of operating the column transfer circuitry to copy the first data comprising a substep of operating the column transfer circuitry to copy data in the respective valid memory element into a respective valid memory element in the second column set.

8. The method of claim 7 in which the step of storing first and second data further comprises a substep of selecting the respective processing unit of the first column set as an initial processing unit; the substep of selecting the respective processing unit of the first column set comprising a substep of setting the respective valid memory element to indicate that the first combination of values is consistent with the constraints.

9. The method of claim 2 in which memory elements in each of the column sets includes a respective valid memory element for indicating whether the repsective combination of values is consistent with the constraints; the first operation determining that the first combination of values is inconsistent with the constraints; the method further comprising a step of setting the first column set's respective valid memory element to indicate that the respective combination of values is inconsistent with the constraints.

10. A processor comprising:
a substrate; and
parallel processing circuitry on the substrate; the parallel processing circuitry comprising:
an array of memory elements that includes two or more row sets of memory elements and two or more column sets of memory elements, each memory element being in a respective one of the row sets and a respective one of the column sets;
row select circuitry for selecting any of the row sets of memory elements; each memory element in a row set being selected when the row set is selected;
for each column set, respective processing circuitry connected for accessing any of the memory elements in the column set; the processing circuitry further being for performing operations on data such that the respective processing circuitry of all of the column sets can perform operations on data in parallel; the memory elements in each column set and the respective processing circuitry forming a respective processing unit; and
column transfer circuitry connected to the respective processing unit of each column set; the column transfer circuitry being for receiving data from the respective processing unit of any of the column sets; the column transfer circuitry further being for transferring data to the respective processing unit of any of the column sets; the column transfer circuitry transferring data from two or more source memory elements to two or more destination memory elements at once:
the array of memory elements further comprising:
for each row set, a respective row select line connected between the row select circuitry and the memory elements of the row set; and
for each column set, a respective column access line connected between the memory elements of the column set and the respective processing circuitry;
the column transfer circuitry further comprising:
for each column set, a respective column select line connected between the respective processing circuitry and the memory elements of the column set so that the respective processing circuitry can select the column set of memory elements:
for each row set, a respective row access line connected between the memory elements of the row set and the respective row access circuitry so that the row access circuitry can read data from a memory element in a column set that is selected by the column select circuitry and can write data to a memory element in a column set that is selected by the column select circuitry; and
a column register connected to the respective row access circuitry of all the row sets for storing data read by the respective row access circuitry and for storing data to be written by the respective row access circuitry so that data can be read from the memory elements of a first one of the column sets by the respective row access circuitry, stored in the column register, and written to the memory elements of a second one of the column sets by the respective row access circuitry.

11. The processor of claim 10 in which the row select circuitry comprises row decode logic for decoding a row identifier that identifies a respective one of the row sets and for selecting the respective row set.

12. The processor of claim 10 in which the respective processing circuitry of each column set comprises respective column access logic for reading data from a memory element in a column set that is selected by the row select circuitry and for writing data to a memory element in a column set that is selected by the row select circuitry.

13. The processor of claim 12 in which the respective processing circuitry of each column set further comprises respective operation logic for performing the operations on data; the respective operation logic being connected for receiving data read from a memory element by the respective column access logic and for providing data to be written to a memory element by the respective column access logic so that the respective operation logic can perform an operation on the data received from the respective column access logic to produce output data and can provide the output data to be written.

14. The processor of claim 13 in which the respective processing circuitry of each column set further comprises a respective temporary memory element; the respective temporary memory element being connected for providing data to the respective operation logic in parallel with data from the respective column access logic; the respective temporary memory element storing data so that the respective operation logic can receive the stored data from the respective temporary memory element and can perform the operation by operating both on the stored data from the respective temporary memory element and on the data received in parallel from the respective column access logic.

15. The processor of claim 14 in which the each column set's respective temporary memory element is connected for receiving data read from a memory element in the column set by the respective column access logic.

16. The processor of claim 14 in which each column set's respective temporary memory element is connected for receiving the output data produced by the respective operation logic.

17. The processor of claim 10 in which the array of memory elements is rectangular, having a first side through which the row select lines extend and having a second side perpendicular to the first side through which the column access lines extend; the row select circuitry being located along the first side and the respective processing circuitry of the column sets being located along the second side.

18. The processor of claim 10, further comprising external connecting circuitry on the substrate for connecting to components that are not on the substrate; the parallel processing circuitry further comprising external transfer circuitry connected for transferring data between the external connecting circuitry and the column register so that data can be transferred between any of the processing units and the external connecting circuitry through the column register.

19. The processor of claim 10 in which the column transfer circuitry further comprises processing unit selection logic for selecting one of the processing units.

20. The processor of claim 19 in which the processing unit selection logic is connected for receiving data from the respective processing circuitry of each column set; the processing unit selection logic selecting the respective processing unit of one of the column sets based on data received from the respective processing circuitry.

21. The processor of claim 10 in which the respective processing circuitry of the column sets performs the operations in response to signals, the parallel processing circuitry further comprising control circuitry for providing a sequence of signals, the control circuitry being connected for providing each of the signals in the sequence to the respective processing circuitry of all of the column sets in parallel.

22. A processor comprising:
a substrate; and
parallel processing circuitry on the substrate; the parallel processing circuitry comprising;
an array of memory elements that includes two or more row sets of memory elements and two or more column sets of memory elements, each memory element being in a respective one of the row sets and a respective one of the column sets;
row select circuitry for selecting any of the two sets of memory elements; each memory element in a row set being selected when the row set is selected;
for each column set, respective processing circuitry connected for accessing any of the memory elements in the column set; the processing circuitry further being for performing operations on data such that the respective processing circuitry of all of the column sets can perform operations on data in parallel; the memory elements in each column set and the respective processing circuitry forming a respective processing unit; and
column transfer circuitry connected to the respective processing unit of each column set; the column transfer circuitry being for receiving data from the respective processing unit of any of the column sets; the column transfer circuitry further being for transferring data to the respective processing unit of any of the column sets; the column transfer circuitry transferring data from two or more source memory elements to two or more destination memory elements at once; the column transfer circuitry comprising a network with two or more connecting lines; the column transfer circuitry further comprising, for each of the column sets, respective switching circuitry for connecting the respective processing unit to any of the connecting lines so that data can be transferred to or from the respective processing unit.

23. The processor of claim 22 in which each memory element is for storing a single bit of data.

24. The processor of claim 22 in which the column transfer circuitry comprises, for each of the column sets, respective switch control circuitry connected for controlling the respective switching circuitry; the respective switch control circuitry of the column sets controlling the respective switching circuitry so that, for each of the connecting lines, the respective switching circuitry of a first one of the column sets connects the respective processing unit to the connecting line for transferring data from the respective processing unit to the connecting line and the respective switching circuitry of a second one of the column sets connects the respective processing unit to the connecting line for transferring data from the connecting line to the respective processing unit.

25. The processor of claim 22, further comprising external connecting circuitry on the substrate for connecting to components that are not on the substrate; the parallel processing circuitry further comprising external transfer circuitry for transferring data between the external connecting circuitry and network; the external transfer circuitry comprising respective switching circuitry for connecting the external connecting circuitry to any of the connecting lines so that data can be transferred between any of the processing units and the external connecting circuitry through the network.

26. The processor of claim 22 in which the respective processing circuitry of each column set comprises respective column access logic for reading data from a memory element in a column set that is selected by the row select circuitry and for writing data to a memory element in a column set that is selected by the row select circuitry.

27. The processor of claim 26 in which the respective processing circuitry of each column set further comprises respective operation logic for performing the operations on data; the respective operation logic being connected for receiving data read from a memory element by the respective column access logic and for providing data to be written to a memory element by the respective column access logic so that the respective operation logic can perform an operation on the data received from the respective column access logic to produce output data and can provide the output data to be written.

28. The processor of claim 27 in which the respective processing circuitry of each column set further comprises a respective temporary memory element; the respective temporary memory element being connected for providing data to the respective operation logic in parallel with data from the respective column access logic; the respective temporary memory element storing data so that the respective operation logic can receive the stored data from the respective temporary memory element and can perform the operation by operating both on the stored data from the respective temporary memory element and on the data received in parallel from the respective column access logic.

29. The processor of claim 28 in which the each column set's respective temporary memory element is connected for receiving data read from a memory element in the column set by the respective column access logic.

30. The processor of claim 28 in which each column set's respective temporary memory element is connected for receiving the output data produced by the respective operation logic.

31. The processor of claim 22 in which the column transfer circuitry further comprises processing unit selection logic for selecting one of the processing units.

32. The processor of claim 31 in which the processing unit selection logic is connected for receiving data from the respective processing circuitry of each column set; the processing unit selection logic selecting the respective processing unit of one of the column sets based on data received from the respective processing circuitry.

33. The processor of claim 22 in which the respective processing circuitry of the column sets performs the operations in response to signals, the parallel processing circuitry further comprising control circuitry for providing a sequence of signals, the control circuitry being connected for providing each of the signals in the sequence to the respective processing circuitry of all of the column sets in parallel.

* * * * *